United States Patent
Yang et al.

(10) Patent No.: US 10,566,331 B1
(45) Date of Patent: Feb. 18, 2020

(54) SEMICONDUCTOR DEVICES

(71) Applicant: Samsung Electronics Co., Ltd., Suwon-si (KR)

(72) Inventors: Jung-gil Yang, Hwaseong-si (KR); Sang-su Kim, Yongin-si (KR); Sun-wook Kim, Seongnam-si (KR); Geum-jong Bae, Suwon-si (KR); Seung-min Song, Hwaseong-si (KR); Soo-jin Jeong, Bucheon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/257,913

(22) Filed: Jan. 25, 2019

(30) Foreign Application Priority Data

Aug. 8, 2018 (KR) .................. 10-2018-0092677

(51) Int. Cl.
*H01L 29/78* (2006.01)
*H01L 27/092* (2006.01)
(Continued)

(52) U.S. Cl.
CPC .... *H01L 27/0924* (2013.01); *H01L 21/02603* (2013.01); *H01L 21/823821* (2013.01);
(Continued)

(58) Field of Classification Search
CPC .................................................. H01L 21/8232
See application file for complete search history.

(56) References Cited

U.S. PATENT DOCUMENTS 7,402,483 B2    7/2008   Yun et al.
9,312,186 B1    4/2016   Su et al.
(Continued)

OTHER PUBLICATIONS

C.-H. Jan, F. AL-Amoody, H.-Y. Chang, T. Chang, Y.-W. Chen, N. Dias, W. Hafez, D. Ingerly, M. Jang, E. Karl, S. K.-Y. Shi, K. Komeyli, H. Kilambi, A. Kumar, K. Byon, C.-G. Lee, J. Lee, T. Leo, P.-C. Liu, N. Nidhi, R. Olac-Vaw, C. Petersburg, K. Phoa, C. Prasad, C. Quincy, R. Ramaswamy, T. Rana, L. Rockford, A. Subramaniam, C. Tsai, P. Vandervoorn, L. Yang, A. Zainuddin, P. Bai, "A 14nm SoC Platform Technology Featuring 2nd Generation Tri-Gate Transistors, 70 nm Gate Pitch, 52 nm Metal Pitch, and 0.0499 um2 SRAM cells, Optimized for Low Power, High Performance and High Density SoC Products," IEEE VLSI 2015, 2015 Symposium on VLSI Technology Digest of Technical Papers, Jun. 2015, T12-T13 (2 pages).

*Primary Examiner* — Cheung Lee
(74) *Attorney, Agent, or Firm* — Muir Patent Law, PLLC

(57) ABSTRACT

A semiconductor device includes: a fin-type active area extending in a first direction protruding from a substrate; a plurality of nanosheet stacked structures; a blocking film covering a part of the upper surface and one sidewall of each of a pair of nanosheet stacked structures adjacent to both sides of the fin-type active area among the plurality of nanosheet stacked structures; a gate electrode extending in a second direction intersecting the first direction on the fin-type active area, the gate electrode including a real gate electrode surrounding the plurality of nanosheets and a dummy gate electrode disposed on the blocking film; and a gate dielectric layer between the real gate electrode and the plurality of nanosheets and between the dummy gate electrode and the blocking film.

20 Claims, 32 Drawing Sheets

(51) Int. Cl.
  *H01L 29/08*    (2006.01)
  *H01L 29/06*    (2006.01)
  *H01L 29/66*    (2006.01)
  *H01L 29/423*   (2006.01)
  *H01L 21/8238*  (2006.01)
  *H01L 21/02*    (2006.01)

(52) U.S. Cl.
  CPC ........ *H01L 21/823828* (2013.01); *H01L 21/823864* (2013.01); *H01L 29/0673* (2013.01); *H01L 29/0847* (2013.01); *H01L 29/42356* (2013.01); *H01L 29/66545* (2013.01); *H01L 29/66795* (2013.01); *H01L 29/785* (2013.01); *H01L 29/7851* (2013.01); *H01L 29/7855* (2013.01)

(56) References Cited

U.S. PATENT DOCUMENTS

| | | |
|---|---|---|
| 9,460,920 B1 | 10/2016 | Sun et al. |
| 9,502,500 B2 | 11/2016 | Leobandung |
| 9,653,547 B1 | 5/2017 | Chang et al. |
| 9,929,160 B1 | 3/2018 | Lee et al. |
| 2015/0372104 A1 | 12/2015 | Liu et al. |
| 2018/0090313 A1 | 3/2018 | Chung et al. |
| 2019/0312107 A1* | 10/2019 | Holland .......... H01L 29/6681 |

\* cited by examiner

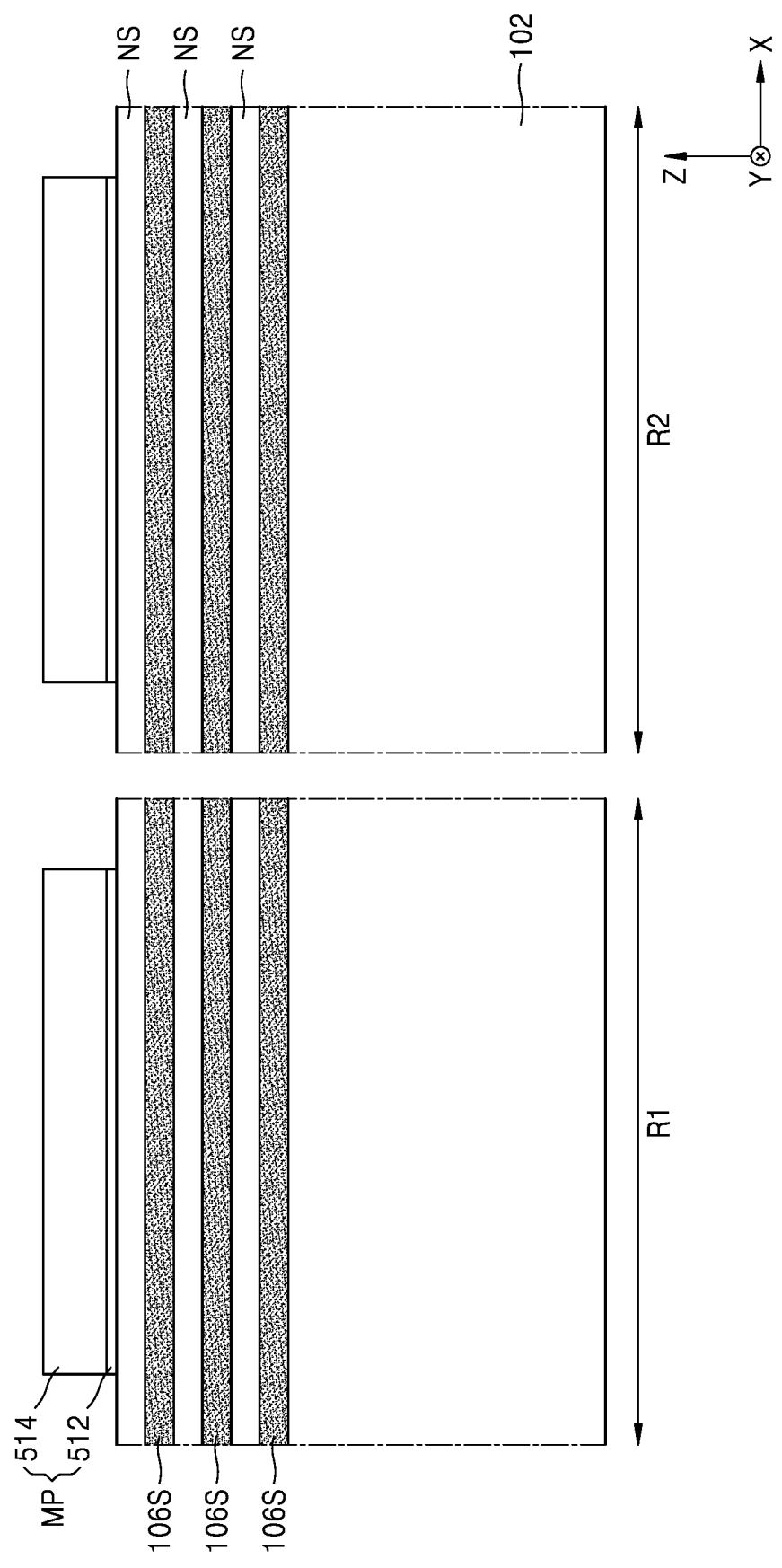

SEMICONDUCTOR DEVICES

CROSS-REFERENCE TO RELATED APPLICATION

This application claims the benefit of priority under 35 U.S.C. § 119 of Korean Patent Application No. 10-2018-0092677, filed Aug. 8, 2018, in the Korean Intellectual Property Office, the disclosure of which is incorporated herein in its entirety by reference.

BACKGROUND

The present disclosure relates to a semiconductor device, and more particularly, to a semiconductor device having a multi-gate metal-oxide-semiconductor field-effect transistor (MOSFET).

As the degree of integration of semiconductor devices increases, the size of a semiconductor device is extremely reduced, and the scaling of the device is reaching its limit. Accordingly, in order to reduce the parasitic resistance and capacitance in the device and to improve the performance of the device, a new method is needed through the structural change of the device.

SUMMARY

The inventive concept provides a semiconductor device with a multi-gate metal-oxide-semiconductor field-effect transistor (MOSFET) that may improve the performance of the semiconductor device.

In some embodiments, the disclosure is directed to a semiconductor device comprising: a fin-type active area extending lengthwise in a first direction and protruding from a substrate; a plurality of nanosheet stacked structures extending in parallel with an upper surface of the fin-type active area at a position spaced above the upper surface of the fin-type active area, each of the plurality of nanosheet stacked structures having a plurality of nanosheets having a channel region; a blocking film covering a part of the upper surface and one sidewall of each of a pair of nanosheet stacked structures adjacent to both sides of the fin-type active area among the plurality of nanosheet stacked structures; a gate electrode extending lengthwise in a second direction intersecting the first direction on the fin-type active area, the gate electrode including a real gate electrode surrounding the plurality of nanosheets and a dummy gate electrode disposed on the blocking film; and a gate dielectric layer between the real gate electrode and the plurality of nanosheets and between the dummy gate electrode and the blocking film.

In some embodiments, the disclosure is directed to a semiconductor device comprising: a substrate including a first region and a second region; a fin-type active area extending lengthwise in a first direction and protruding from the substrate in each of the first region and the second region; a plurality of nanosheet stacked structures extending in parallel with an upper surface of the fin-type active area at a position spaced above the upper surface of the fin-type active area, each of the plurality of nanosheet stacked structures having a plurality of nanosheets having a channel region; a blocking film covering a part of an upper surface and one sidewall of each of a pair of nanosheet stacked structures adjacent to both sides of the fin-type active area among the plurality of nanosheet stacked structures, in the first region; a plurality of gate electrodes overlapping with at least a portion of each of the plurality of nanosheet stacked structures on the fin-type active area and extending lengthwise in a second direction intersecting the first direction; and a plurality of residual semiconductor patterns in a space between the fin-type active area and the plurality of nanosheets of the pair of nanosheet stacked structures covered by the blocking film among the plurality of nanosheet stacked structures, wherein a portion of the plurality of gate electrodes, which extends on the nanosheet stacked structures not covered by the blocking film, fills a space between the plurality of nanosheets and the fin-type active area.

In some embodiments, the disclosure is directed to a semiconductor device comprising: a substrate including a first region and a second region; a fin-type active area extending lengthwise in a first direction and protruding from the substrate in each of the first region and the second region; a plurality of nanosheet stacked structures extending lengthwise in parallel with an upper surface of the fin-type active area at a position spaced above the upper surface of the fin-type active area, each of the plurality of nanosheet stacked structures having a plurality of nanosheets having a channel region; a first source/drain region and a second source/drain region which are disposed in the first region and the second region between the plurality of nanosheet stacked structures to be connected to the plurality of nanosheets and are made of different materials from each other; a first blocking film covering a part of an upper surface and one sidewall of each of a pair of nanosheet stacked structures adjacent to both sides of the fin-type active area among the plurality of nanosheet stacked structures, in the first region; a plurality of gate electrodes overlapping with at least a portion of each of the plurality of nanosheet stacked structures on the fin-type active area and extending in a second direction intersecting the first direction; and a gate dielectric layer between the plurality of gate electrodes and the plurality of nanosheets, wherein the plurality of nanosheets included in each of the pair of nanosheet stacked structures covered by the first blocking film are spaced apart from a gate dielectric film with the first blocking film therebetween, and wherein the plurality of nanosheets included in a remainder of the plurality of nanosheets stacked structures are in contact with the gate dielectric layer.

BRIEF DESCRIPTION OF THE DRAWINGS

Embodiments of the inventive concept will be more clearly understood from the following detailed description taken in conjunction with the accompanying drawings in which:

FIG. 28 is a cross-sectional view taken along the X-Z plane.

DETAILED DESCRIPTION OF THE EMBODIMENTS

FIGS. 1 to 16 are cross-sectional views illustrating a method of manufacturing a semiconductor device, according to exemplary embodiments of the present disclosure, and a semiconductor device manufactured by the method, according to a process order. Specifically, FIGS. 1, 2A, 3A, 4A, 5A, and 6 to 16 are cross-sectional views taken along the X-Z plane, and FIGS. 2B, 3B, 4B, and 5B are cross-sectional views taken along the Y-Z plane in each of FIGS. 2A, 3A, 4A, and 5A, and since the same shape is shown in a first region R1 and a second region R2, the first region R1 is not distinguished from the second region R2.

Figure 1:
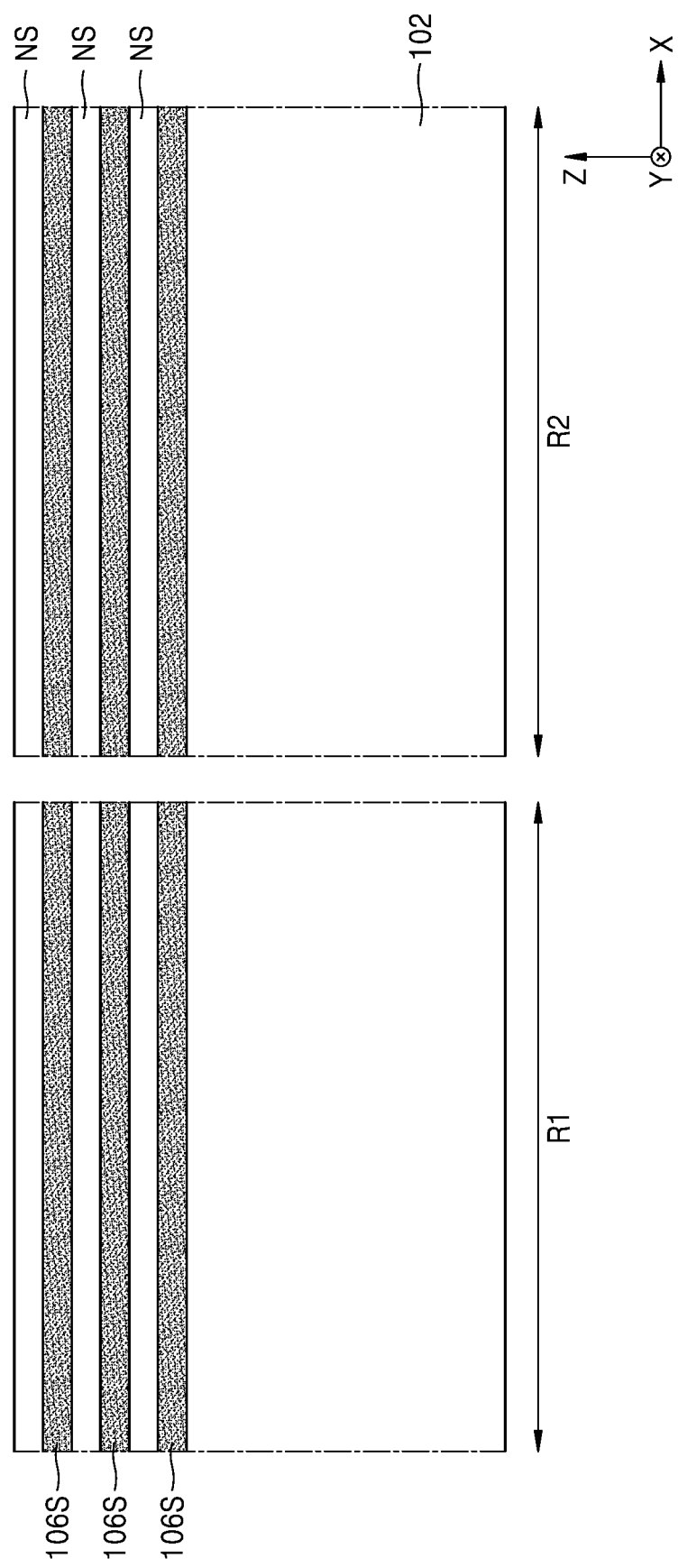
FIGS. 1 to 16 are cross-sectional views illustrating a method of manufacturing a semiconductor device, according to exemplary embodiments of the present disclosure, and a semiconductor device manufactured by the method, according to a process order.

Referring to FIG. 1, a plurality of sacrificial semiconductor layers 106S and a plurality of nanosheet semiconductor layers NS are alternately stacked on a substrate 102 having the first region R1 and the second region R2. In some embodiments, a PMOS transistor is formed in the first region R1 of the substrate 102, and an NMOS transistor is formed in the second region R2 to thereby form a CMOS device, but the present disclosure is not limited to this example.

The substrate 102 may include a semiconductor such as Si or Ge or a compound semiconductor such as SiGe, SiC, GaAs, InAs, or InP. In some embodiments, the substrate 102 may include at least one of a Group III-V material and a Group IV material. The Group III-V material may be a binary, ternary, or quaternary compound including at least one Group III element and at least one Group V element. The Group III-V material may be a compound containing at least one element of In, Ga and Al as a Group III element and at least one element of As, P and Sb as a Group V element. For example, the Group III-V material may be selected from InP, InzGa1-zAs (0≤Z≤1), and AlzGa1-zAs (0≤Z≤1). The binary compound may be, for example, any one of InP, GaAs, InAs, InSb, and GaSb. The ternary compound may be any one of InGaP, InGaAs, AlInAs, InGaSb, GaAsSb, and GaAsP. The Group IV material may be Si or Ge. However, the Group III-V material and the Group IV material that may be used in the integrated circuit device according to the technical idea of the present disclosure are not limited to the above examples. The Group III-V material and the Group IV material such as Ge may be used as a channel material capable of forming a low-power, high-speed transistor. A high-performance CMOS may be formed by using a semiconductor substrate made of a Group III-V material, such as GaAs, having a higher electron mobility than the Si substrate, and a semiconductor substrate, such as Ge, having a higher degree of hole mobility than the Si substrate. In some embodiments, when forming an NMOS transistor on the substrate 102, the substrate 102 may be made of any of the above-described Group III-V materials. In some other embodiments, when forming a PMOS transistor on the substrate 102, at least a portion of the substrate 102 may be made of Ge. In another example, the substrate 102 may have a semiconductor on insulator (SOI) structure, such as silicon on insulator. The substrate 102 may include a conductive region, for example, a well doped with an impurity, or a structure doped with an impurity.

The plurality of sacrificial semiconductor layers 106S and the plurality of nanosheet semiconductor layers NS may be made of different semiconductor materials. In some embodiments, the plurality of nanosheet semiconductor layers NS may be made of a single material. In some embodiments, the plurality of nanosheet semiconductor layers NS may be made of the same material as the material of the substrate 102.

In some embodiments, the plurality of sacrificial semiconductor layers 106S may be made of SiGe, and the plurality of nanosheet semiconductor layers NS may be made of Si, but the present disclosure is not limited to these examples.

The plurality of sacrificial semiconductor layers 106S may be formed to have the same thickness, but the technical idea of the present disclosure is not limited to this example. In some embodiments, the thickness of the sacrificial semiconductor layer 106S closest to the substrate 102 among the plurality of sacrificial semiconductor layers 106S may be greater than the thickness of the remaining sacrificial semiconductor layer 106S.

Figure 2B:
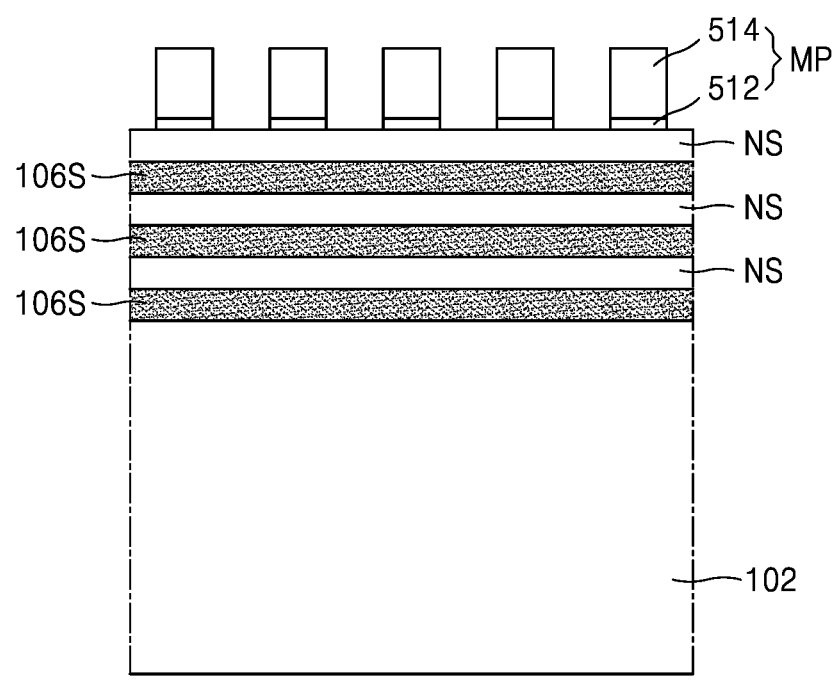

Referring to FIGS. 2A and 2B, a mask pattern MP is formed on the stacked structure of the plurality of sacrificial semiconductor layers 106S and the plurality of nanosheet semiconductor layers NS in each of the first region R1 and the second region R2. The mask pattern MP may be formed of a plurality of line patterns extending in parallel in one direction (X direction).

The mask pattern MP may include a pad oxide film pattern 512 and a hard mask pattern 514. The hard mask pattern 514 may be formed of silicon nitride, polysilicon, a spin-on hardmask (SOH) material, or a combination thereof, but the present disclosure is not limited to this example. In some embodiments, the SOH material may be formed of a hydrocarbon compound or a derivative thereof having a relatively high carbon content of about 85 wt % to about 99 wt % carbon based on the total weight of the SOH material.

Figure 3A:
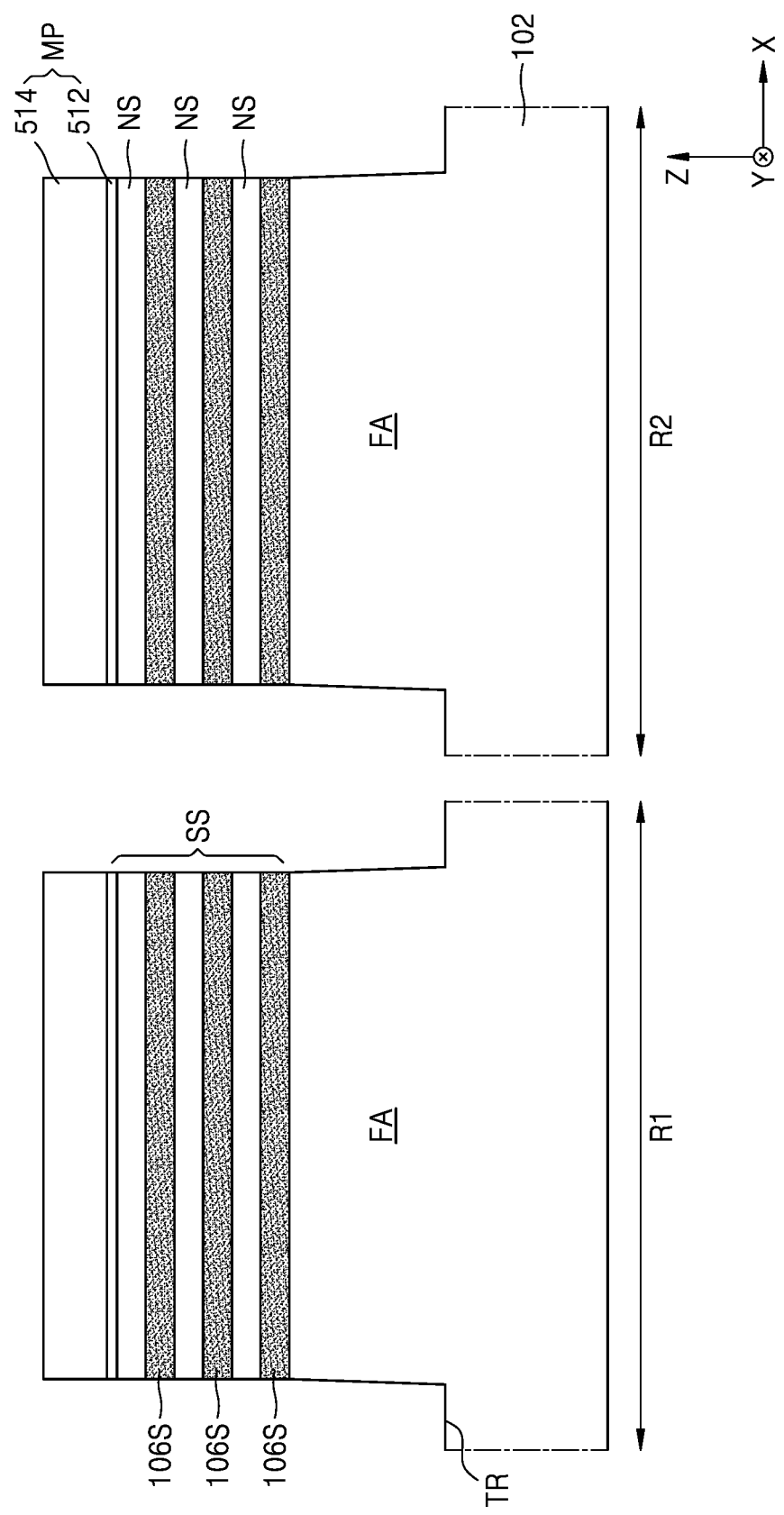
Figure 3B:
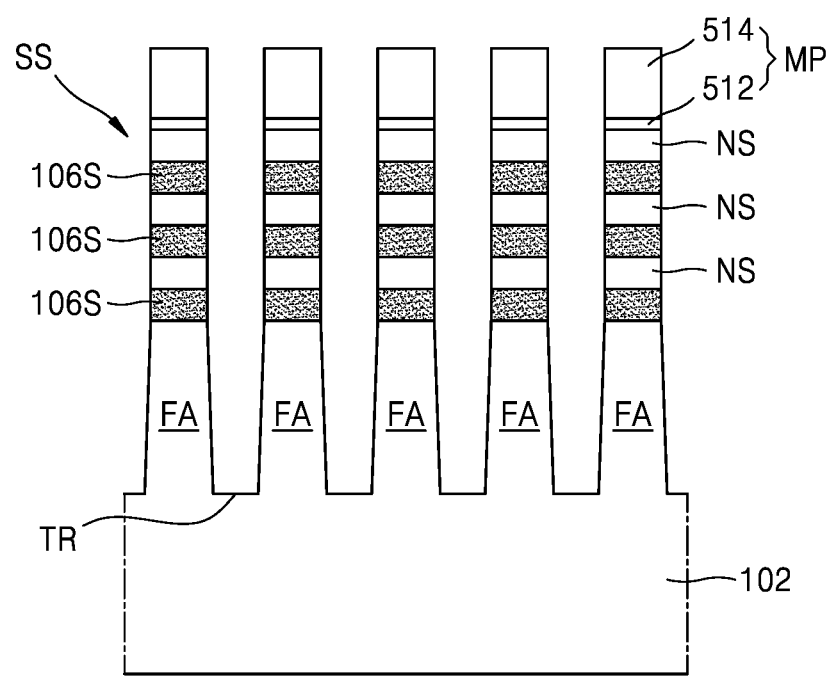

Referring to FIGS. 3A and 3B, a stacked structure SS of a plurality of sacrificial semiconductor layers 106S and a plurality of nanosheet semiconductor layers NS is formed by using a mask pattern MP as an etching mask, and a plurality of trenches TR is formed by etching a part of the substrate 102. As a result, a plurality of fin-type active areas FA defined by a plurality of trenches TR may be formed in each of the first region R1 and the second region R2.

After a plurality of fin-type active areas FA are formed, a stacked structure SS of the plurality of sacrificial semiconductor layers 106S and the plurality of nanosheet semiconductor layers NS remains on the plurality of fin-type active areas FA.

Figure 4A:
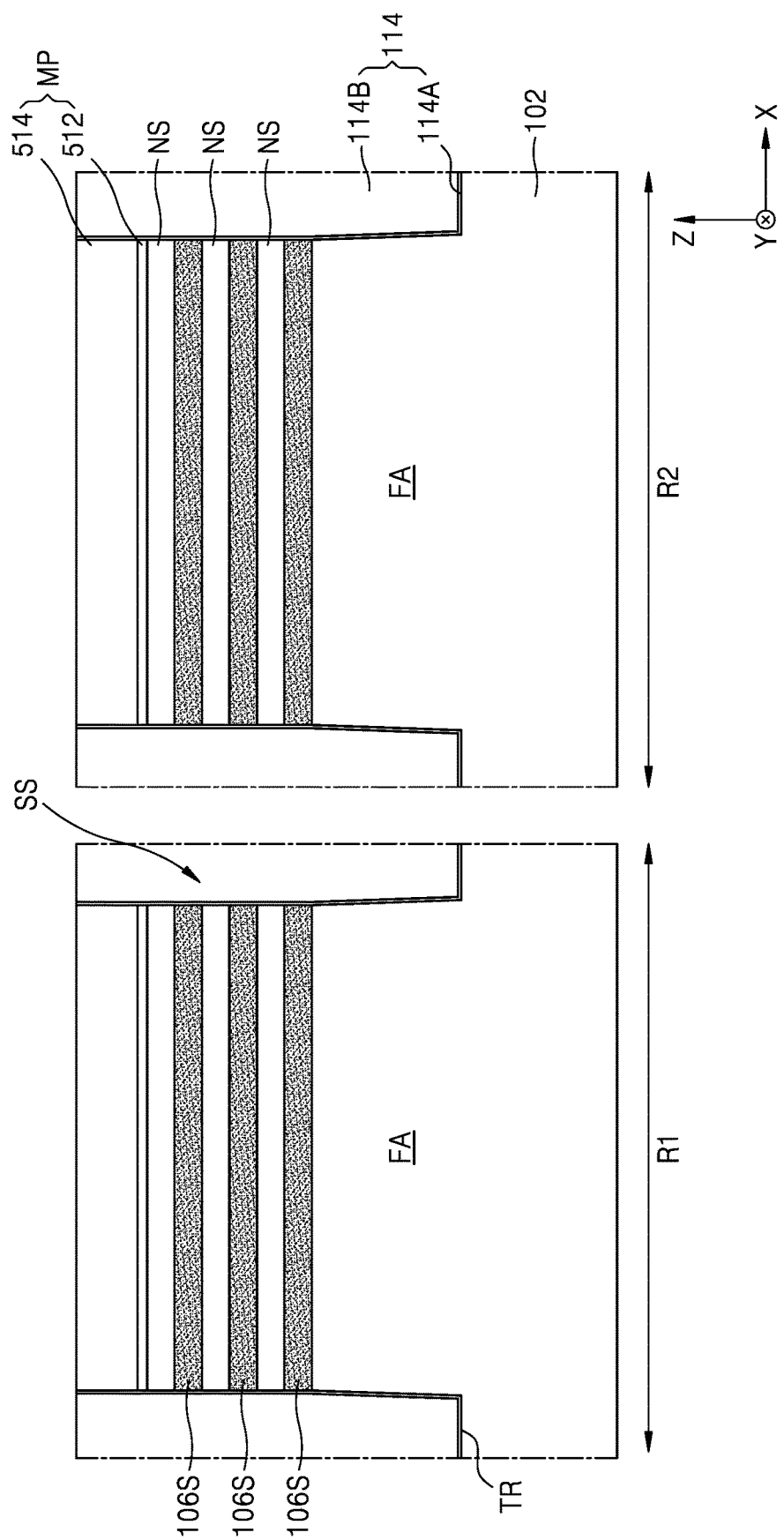
Figure 4B:
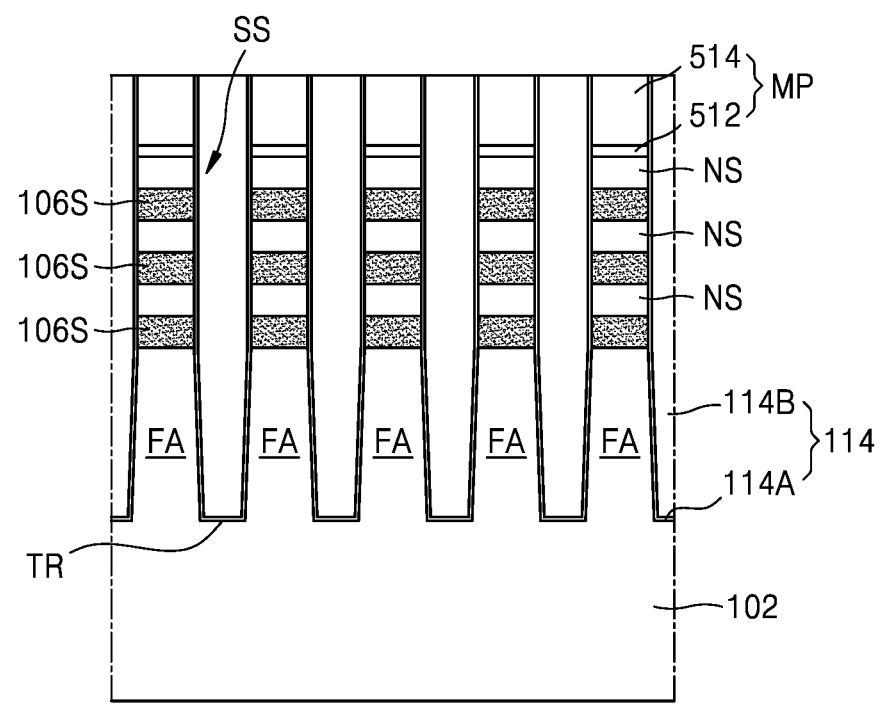
Figure 5A:
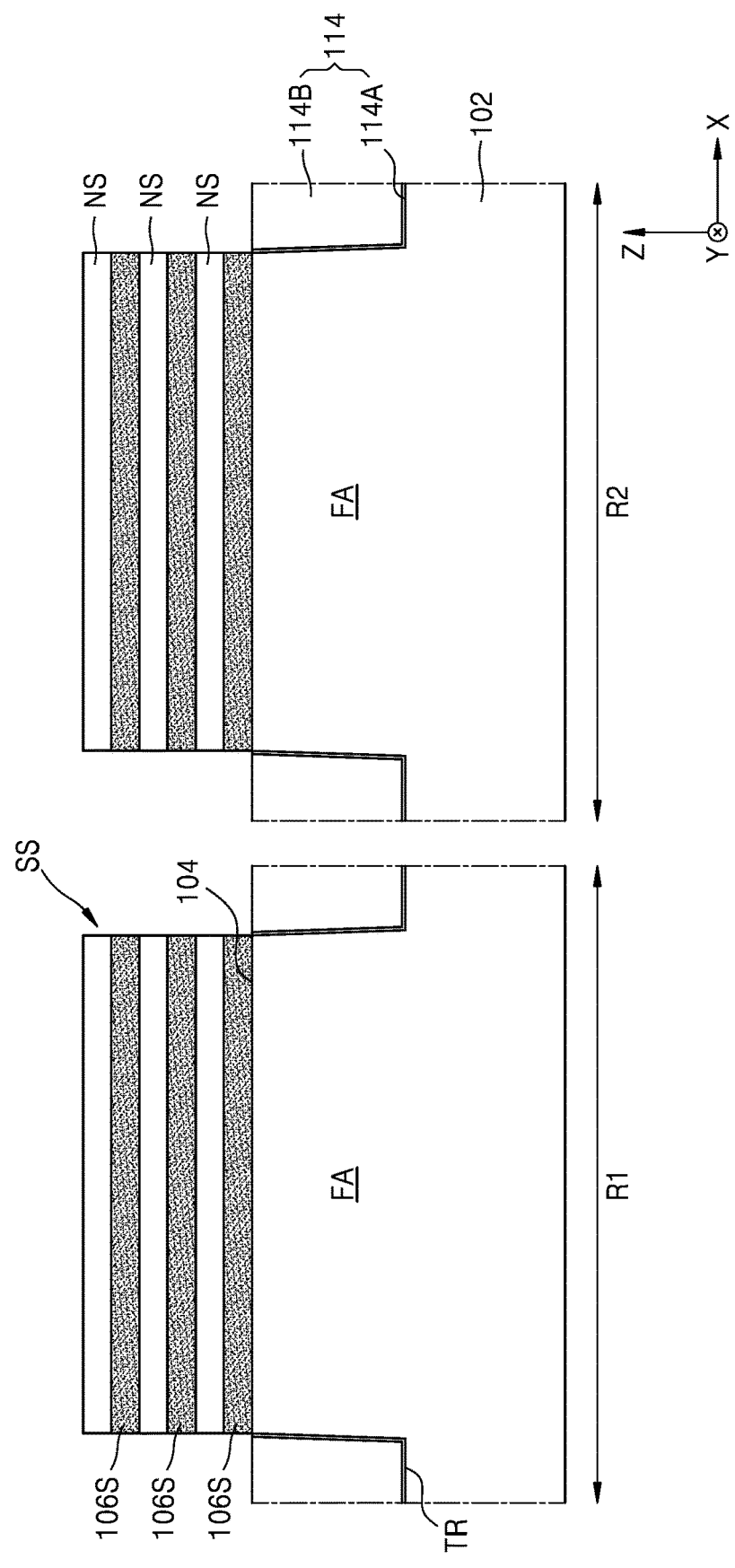
Figure 5B:
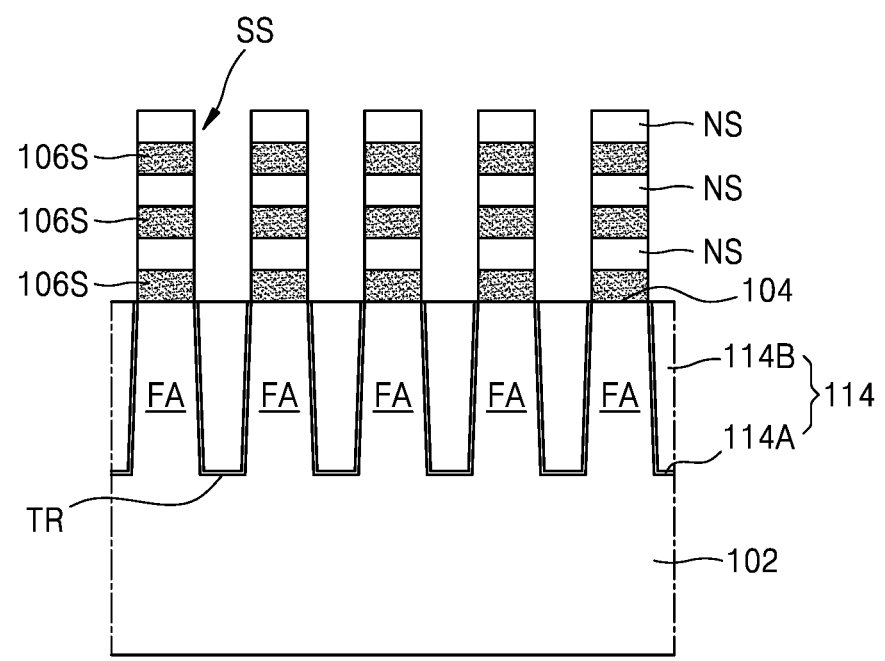

Referring to FIGS. 4A and 4B together, a device isolation film 114 is formed within a plurality of trenches TR. The device isolation film 114 may include an insulating liner 114A that conformally covers an inner wall of a plurality of trenches TR. For example, the insulating liner 114A may conformally cover a bottom surface of the trench TR, sidewalls of the fin-type active areas FA, sidewalls of the stacked structure SS of the plurality of sacrificial semiconductor layers 106S and the plurality of nanosheet semiconductor layers NS, and sidewalls of the mask pattern MP. A gap fill insulating film 114B may be formed on the insulating liner 114A and fill the plurality of trenches TR.

The device isolation film 114 may be formed to cover the sidewall of the stacked structure SS and the sidewall of the mask pattern MP.

The insulating liner 114A covering the inner walls of the plurality of trenches TR may include an oxide film, a nitride film, an oxynitride film, polysilicon, or a combination thereof. In some embodiments, the insulating liner 114A may have a thickness of about 10-100 Å.

In some embodiments, the gap fill insulating film 114B may be made of an oxide film. In some embodiments, the gap fill insulating film 114B may include an oxide film formed by a deposition process or a coating process. In some embodiments, the gap fill insulating film 114B may include an oxide film formed by a flowable chemical vapor deposition (FCVD) process or a spin coating process.

Referring to 5A and 5B together, a recess process of removing the mask pattern MP remaining on the stacked structure SS of the plurality of sacrificial semiconductor layers 106S and the plurality of nanosheet semiconductor layers NS and removing the device isolation film 114 from the upper portion by a certain thickness is performed.

The recess process may be performed such that the upper surface of the device isolation film 114 is to be at a level approximately equal to or similar to the upper surface 104 of the fin-type active area FA. For example, after the recess process is performed, the upper surface of the device isolation film 114 may be at substantially the same level as the upper surface 104 of the fin-type active area FA. As a result, the sidewall of the stacked structure SS of the plurality of sacrificial semiconductor layers 106S and the plurality of nanosheet semiconductor layers NS on the plurality of fin-type active areas FA may be exposed. Items described as "substantially the same" or "substantially equal" may be exactly the same or equal, or may be the same or equal within acceptable variations that may occur, for example, due to manufacturing processes.

In order to perform the recess process, a dry etching, a wet etching, or a dry-and-wet combined etching process may be used.

In some embodiments, after the mask pattern MP is removed and before performing the recess process of removing the device isolation film 114 from the top thereof by a certain thickness, an ion implantation process for implanting the impurity ions for controlling the threshold voltage into the upper part of the plurality of fin-type active areas FA and the plurality of nanosheet semiconductor layers NS. In some embodiments, during the impurity ion implantation process for threshold voltage adjustment, phosphorus (P) or arsenic (As) ions may be implanted into the first region R1 as impurities, and boron (B) ions may be implanted into the second region R2 as impurities.

Figure 6:
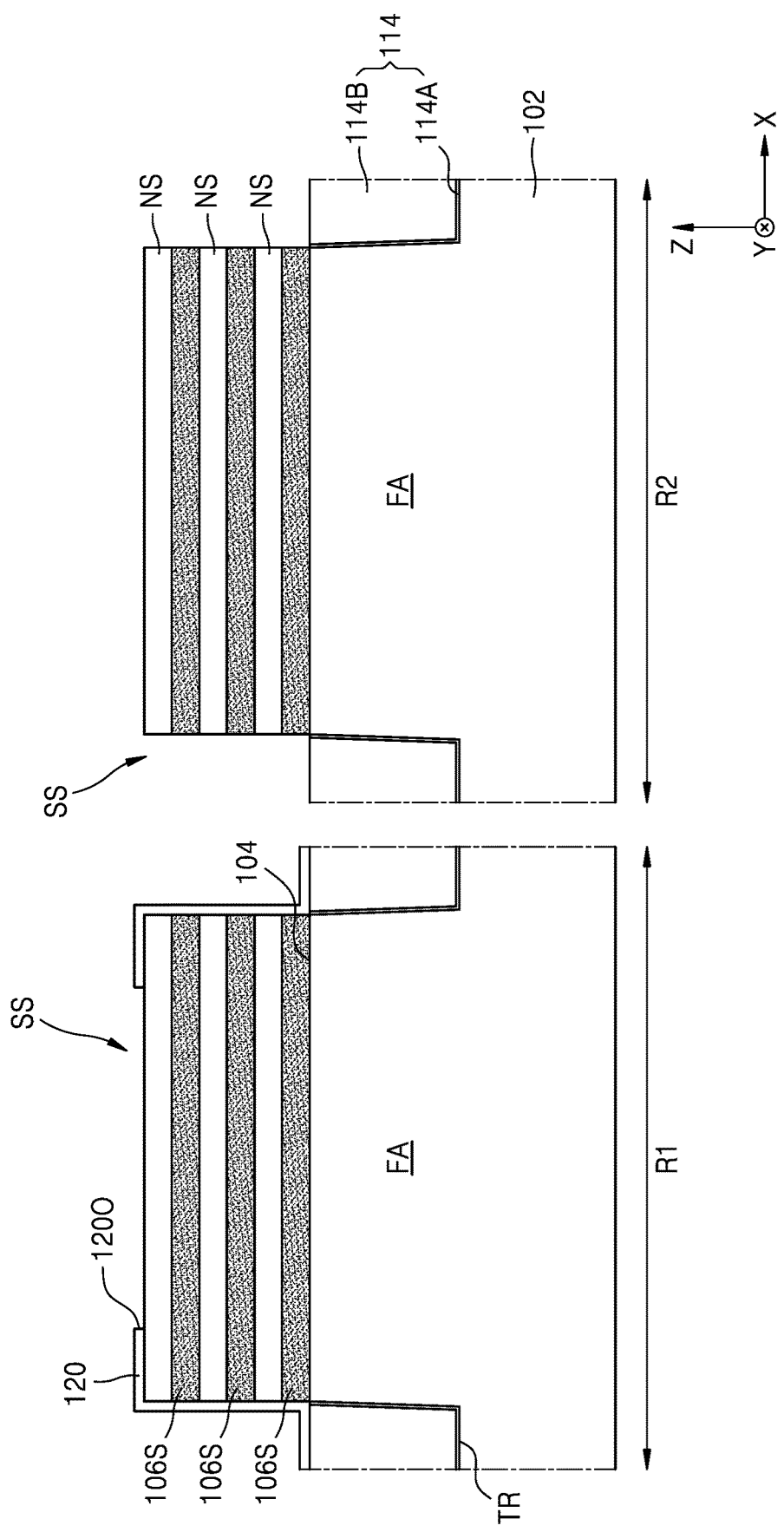

Referring to FIG. 6, a blocking film 120 is formed on the first region R1 to cover a part of the upper surface the sidewalls of the stacked structure SS of the plurality of sacrificial semiconductor layers 106S and the plurality of nanosheet semiconductor layers NS. The blocking film 120 may have an opening 120O exposing the remaining part of the upper surface of the stacked structure SS of the plurality of sacrificial semiconductor layers 106S and the plurality of nanosheet semiconductor layers NS. The blocking film 120 may cover a part of the upper surface of the uppermost nanosheet semiconductor layer NS among the plurality of nanosheet semiconductor layers NS while not covering the remaining part of the upper surface of the uppermost nanosheet semiconductor layer NS. For example, the blocking film 120 may be formed to cover opposite outside portions of the stacked structure SS of the plurality of sacrificial semiconductor layers 106S and the plurality of nanosheet semiconductor layers NS in the X direction, while leaving inside portions between the two opposing outside portions exposed. The blocking film 120 in the first region R1 may cover a part of the upper surface of the stacked structure SS and the upper surface of the device isolation film 114 together with the sidewall.

The blocking film 120 may include, for example, nitride. In some other embodiments, the blocking film 120 may be formed of silicon nitride, polysilicon, or a combination thereof, but the present disclosure is not limited to this example.

The blocking film 120 may be formed only in the first region R1 and may not be formed in the second region R2.

Figure 7:
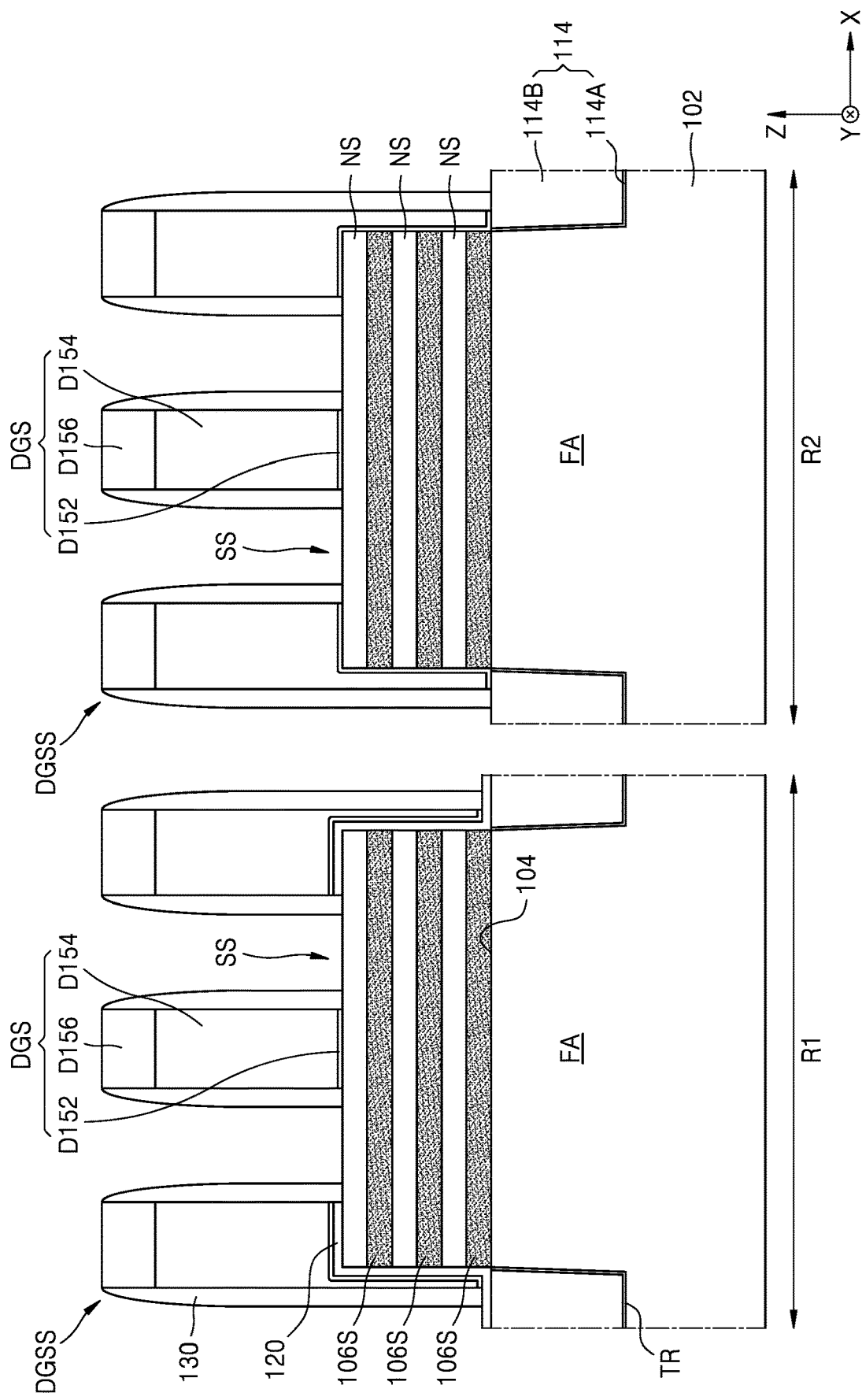
Figure 8:
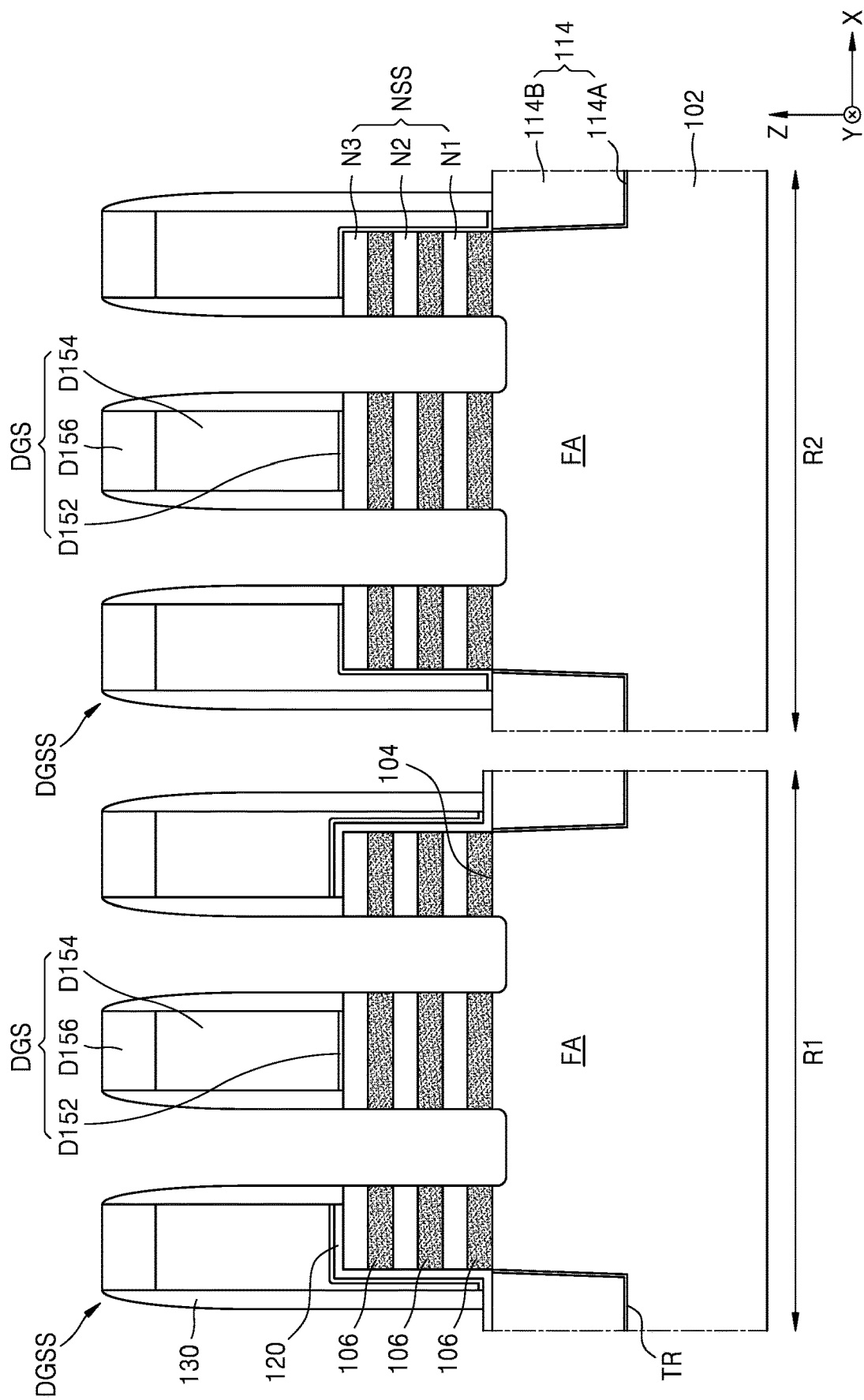

Referring to FIG. 7, at least one dummy gate structure (DGS) extending across at least a portion of the plurality of fin-type active areas FA are formed on the fin-type active area FA where the stacked structure SS of the plurality of sacrificial semiconductor layers 106S and the plurality of nanosheet semiconductor layers NS are formed, in each of the first region R1 and the second region R2.

The dummy gate structure (DGS) may have a structure in which an oxide film D152, a dummy gate layer D154, and a capping layer D156 are sequentially stacked. In one example for forming the dummy gate structure (DGS), the oxide film D152, the dummy gate layer D154, and the capping layer D156 may be sequentially formed to cover the exposed surface of the stacked structure SS of the plurality of sacrificial semiconductor layers 106S covering the plurality of fin-type active areas FA and the plurality of nanosheet semiconductor layers NS, and the upper surface of the device isolation film 114. Then the oxide film D152, the dummy gate layer D154, and the capping layer D156 may be patterned, such that they are left only in certain portions.

In some embodiments, the dummy gate layer D154 may be made of polysilicon, and the capping layer D156 may be made of a silicon nitride film, but the present disclosure is not limited to this example.

Thereafter, a gate spacer 130 is formed to cover both sidewalls of the dummy gate structure DGS. In order to form the gate spacer 130, a spacer layer may be formed on the substrate 102 on which the dummy gate structure DGS is formed, and then the spacer layer may be etched back to leave the gate spacer 130. The gate spacer 130 may include, for example, a silicon nitride film.

An edge dummy gate structure DGSS that is a part of the dummy gate structure DGS may be formed over the upper surface and sidewalls of the stacked structure SS. Specifically, the oxide film D152 of the edge dummy gate structure DGSS and the dummy gate layer D154 may be formed over the upper surface and sidewalls of the stacked structure SS.

In the first region R1, the oxide film D152 and the dummy gate layer D154 of the edge dummy gate structure DGSS may be overlapped with the blocking film 120 in the vertical direction (Z direction). In the first region R1, the blocking film 120 is between the oxide film D152 of the edge dummy gate structure DGSS and the upper surface and sidewalls of the stacked structure SS so that the edge dummy gate structure DGSS and the stacked structure SS may be spaced apart from each other with the blocking film 120 therebetween.

Since the blocking film 120 is not formed in the second region R2, the oxide film D152 and the stacked structure SS of the edge dummy gate structure DGSS may contact each other. The term "contact," as used herein, refers to a direct connection (i.e., touching) unless the context indicates otherwise.

Referring to 7 and 8, a plurality of nanosheet stacked structures NSS including a plurality of nanosheets N1, N2, and N3 are formed from the plurality of nanosheet semiconductor layers NS by removing a part of the stacked structure SS of the plurality of sacrificial semiconductor layers 106S and the plurality of nanosheet semiconductor layers NS by using the dummy gate structure DGS and the gate spacer 130 as an etching mask, and a plurality of sacrificial semiconductor patterns 106 are formed from the plurality of sacrificial semiconductor layers 106S.

After the plurality of nanosheet stacked structures NSS are formed, the fin-type active area FA may be exposed between the plurality of respective nanosheet stacked structures NSS. In some embodiments, in the process of etching the stacked structure SS of the plurality of sacrificial semiconductor layers 106S and the plurality of nanosheet semiconductor layers NS, a part of an upper portion of the fin-type active area FA may be removed together. For example, the part of the upper portion of the fin-type active area FA may be removed, thereby forming a recess portion in the upper surface of the of the fin-type active area FA.

It is illustrated that both sidewalls of the plurality of nanosheets N1, N2, and N3 and the plurality of sacrificial semiconductor patterns 106, which are respectively included in the plurality of nanosheets NSS, are perpendicular to the main surface of the substrate 102, but the present disclosure is not limited to this example.

Figure 9:
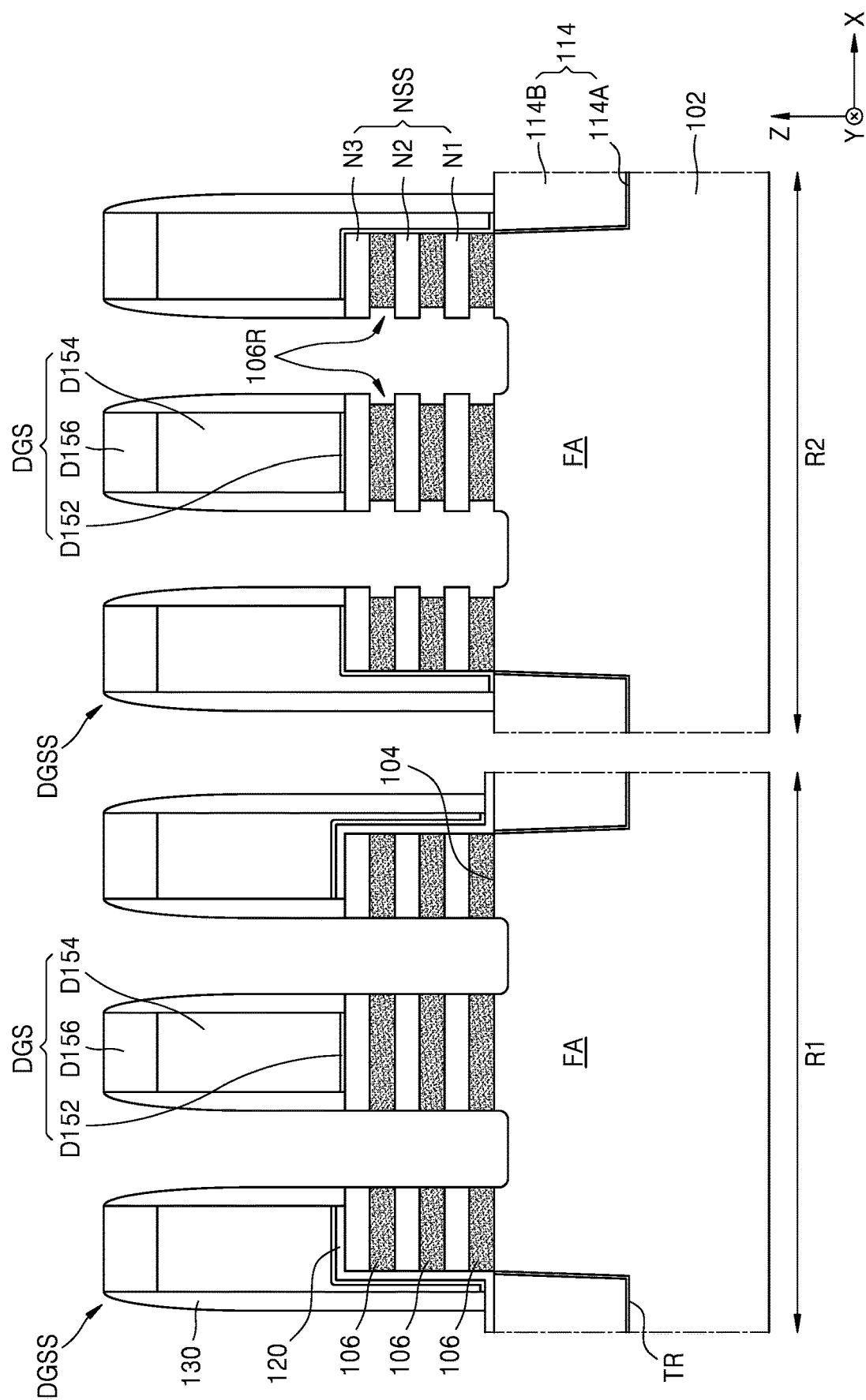

Referring to FIG. 9, a recess region 106R is formed between the plurality of respective nanosheets N1, N2, and N3 by removing a part of the plurality of sacrificial semiconductor patterns 106 exposed on both sides of each of the plurality of nanosheet stacked structures NSS by using an isotropic etching process for the second region R2. While the recess region 106R is formed in the second region R2, the recess region 106R may not be formed in the first region R1 because the first region R1 is covered by a mask layer (not shown).

Both sidewalls of the plurality of sacrificial semiconductor patterns 106 exposed in the recess region 106R are shown as being perpendicular to the main surface of the substrate 102, but the present disclosure is not limited to this example.

In some embodiments, the isotropic etching process for forming the recess region 106R may be performed by using a wet etch process which uses etch selectivity differences between the plurality of sacrificial semiconductor patterns 106 and the plurality of nanosheets N1, N2, and N3.

The width of the plurality of sacrificial semiconductor patterns 106 in the horizontal direction in which the recess region 106R is formed and remained in the second region R2 may be similar to the width of the dummy gate layer D154 in the horizontal direction. For example, the width in the horizontal direction of the recess region 106R may be substantially the same as the width in the horizontal direction of the lower portion of the gate spacer 130. In some embodiments, the width of the plurality of sacrificial semiconductor patterns 106 in the horizontal direction in which the recess region 106R is formed and remained in the second region R2 may be greater than the width of the dummy gate layer D154 in the horizontal direction. For example, the width in the horizontal direction of the recess region 106R may be less than the width in the horizontal direction of the lower portion of the gate spacer 130. In some other embodiments, the width of the plurality of sacrificial semiconductor patterns 106 in the horizontal direction in which the recess region 106R is formed and remained in the second region R2 may be less than the width of the dummy gate layer D154 in the horizontal direction. For example, the width in the horizontal direction of the recess region 106R may be greater than the width in the horizontal direction of the lower portion of the gate spacer 130.

Figure 10:
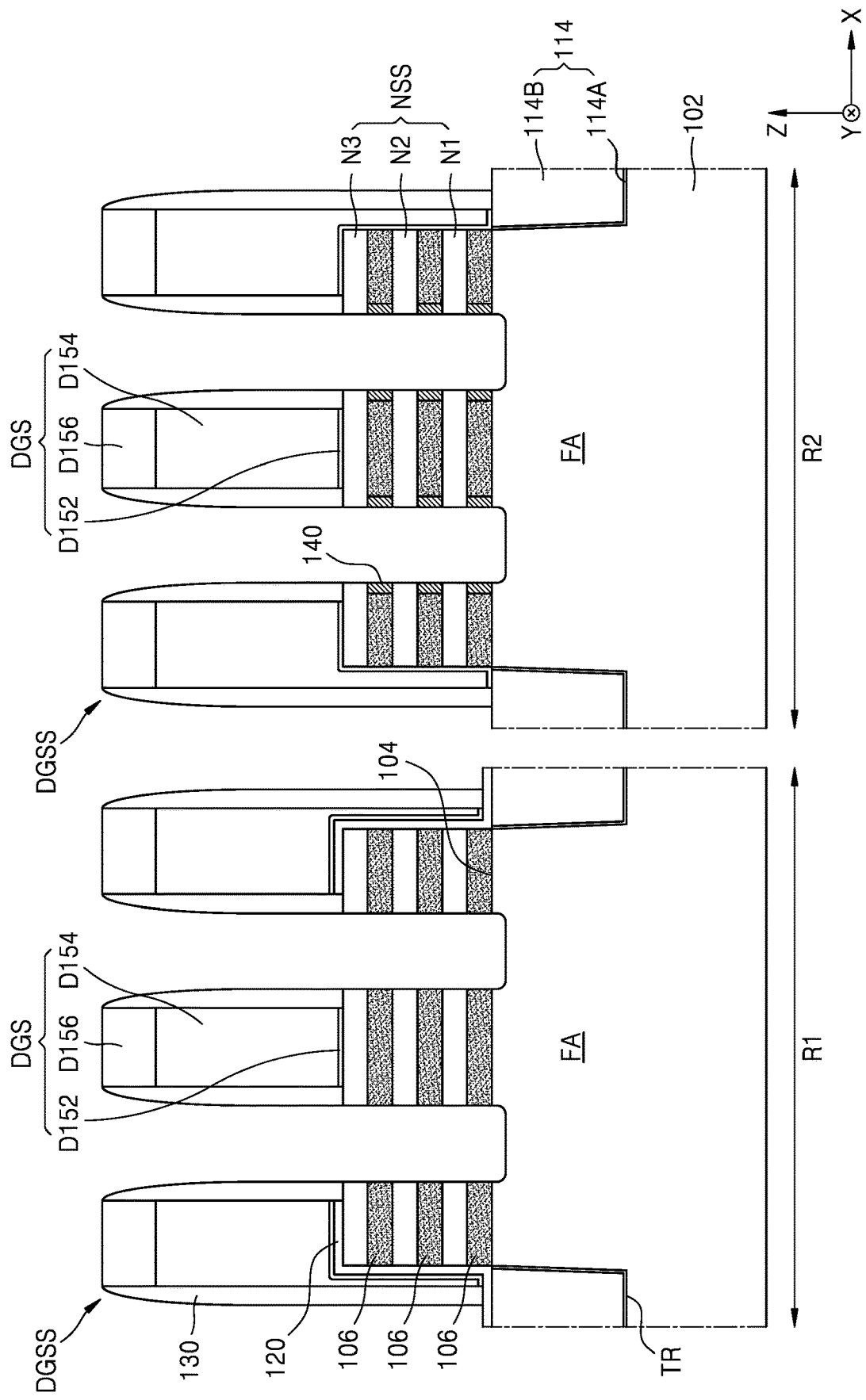

Referring to FIGS. 9 and 10, an insulating spacer 140 is formed in the second region R2 to fill the recess region 106R formed between the plurality of respective nanosheets N1, N2, and N3. In some embodiments, the insulating spacer 140 may include a silicon nitride film. In some embodiments, the insulating spacer 140 may be formed by stacking a plurality of insulating layers.

In some embodiments, the width of the insulating spacer 140 in the horizontal direction may be substantially similar to the width of the lower portion of the gate spacer 130 in the horizontal direction. In other embodiments, the width of the insulating spacer 140 in the horizontal direction may be less than or greater than the width of the lower portion of the gate spacer 130 in the horizontal direction.

It is illustrated that at least one sidewall of the insulating spacer 140 is perpendicular to the main surface of the substrate 102, but the present disclosure is not limited to this example.

Figure 11:
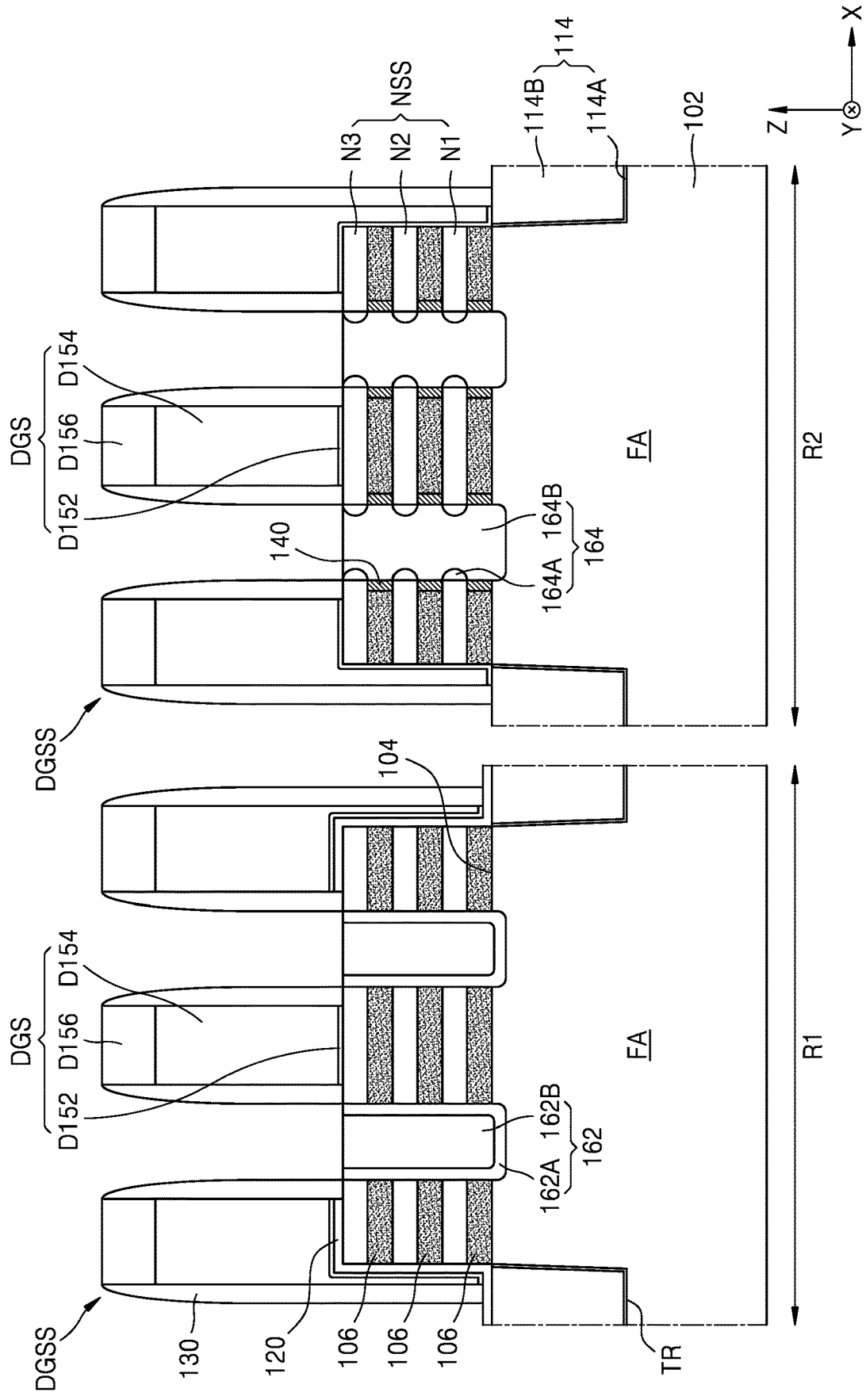

Referring to FIG. 11, the sidewalls of the plurality of nanosheets N1, N2 and N3 and the surface of the fin-type active area FA exposed between the respective nanosheet stacked structures NSS are exposed to a cleaning atmosphere to thereby remove a native oxide film from the exposed surfaces.

Thereafter, in the first region R1, a first source/drain region 162 is formed by allowing a semiconductor material to be epitaxially grown from both exposed sidewalls of the plurality of nanosheets N1, N2, and N3 and the exposed surface of the fin-type active area FA. In the second region R2, a second source/drain region 164 is formed by allowing a semiconductor material to be epitaxially grown from both exposed sidewalls of the plurality of nanosheets N1, N2, and N3 and the exposed surface of the fin-type active area FA.

A mask layer (not shown) covering the second region R2 may be formed while the first source/drain region 162 is formed in the first region R1, and the mask layer (not shown) covering the first region R1 may be formed while the second source/drain region 164 is formed in the second region R2.

The first source/drain region 162 may include a first cover layer 162A and a first buried layer 162B. The first cover layer 162A may be formed in the first region R1 in order to cover exposed sidewalls of the plurality of nanosheets N1, N2, and N3, sidewalls of the plurality of sacrificial semiconductor patterns 106, and the exposed surface of the fin-type active area FA, and the first buried layer 162B may be formed on the first cover layer 162A in the first region R1 to fill a space between the plurality of nanosheet stacked structures NSS. The upper surface of the first cover layer 162A may be at the same vertical height as the upper surface of the first buried layer 162B.

The first source/drain region 162 may include Ge. The first cover layer 162A may be made of a semiconductor material including Si, and the first buried layer 162B may be made of a semiconductor material including Ge. In some embodiments, the first cover layer 162A may be made of a semiconductor material that does not include Ge. For example, the first cover layer 162A may be made of a semiconductor material such as Si. The first buried layer 162B may be made of a compound semiconductor material such as SiGe containing Ge or a semiconductor material such as Ge rather than the first cover layer 162A. In some embodiments, the first buried layer 162B may have a multi-layer structure of a semiconductor material including Ge and a semiconductor material including Si which covers the first cover layer 162A.

In some embodiments, at least a portion of the first source/drain region 162 may include boron (B) ions as impurities.

The second source/drain region 164 may include a second cover layer 164A and a second buried layer 164B. The second cover layer 164A may be formed to cover the exposed sidewalls of the plurality of nanosheets N1, N2, and N3 in the second region R2, and the second buried layer 164B may be formed on the second cover layer 164A in the second region R2 to fill a space between the plurality of nanosheet stacked structures NSS. Each second cover layer 164A may have the same height in the Z direction as the adjacent nanosheets N1, N2, and N3, and may have a rounded shape in the X direction.

The second source/drain region 164 may include Si. The second source/drain region 164 may not include Ge, unlike the first source/drain region 162. The second cover layer 164A may be made of a semiconductor material including Si, and the second buried layer 164B may be made of a semiconductor material such as Si or a compound semiconductor material such as SiC.

In some embodiments, at least a portion of the second source/drain regions 164 may include phosphorus (P) or arsenic (As) ions as impurities.

Figure 12:
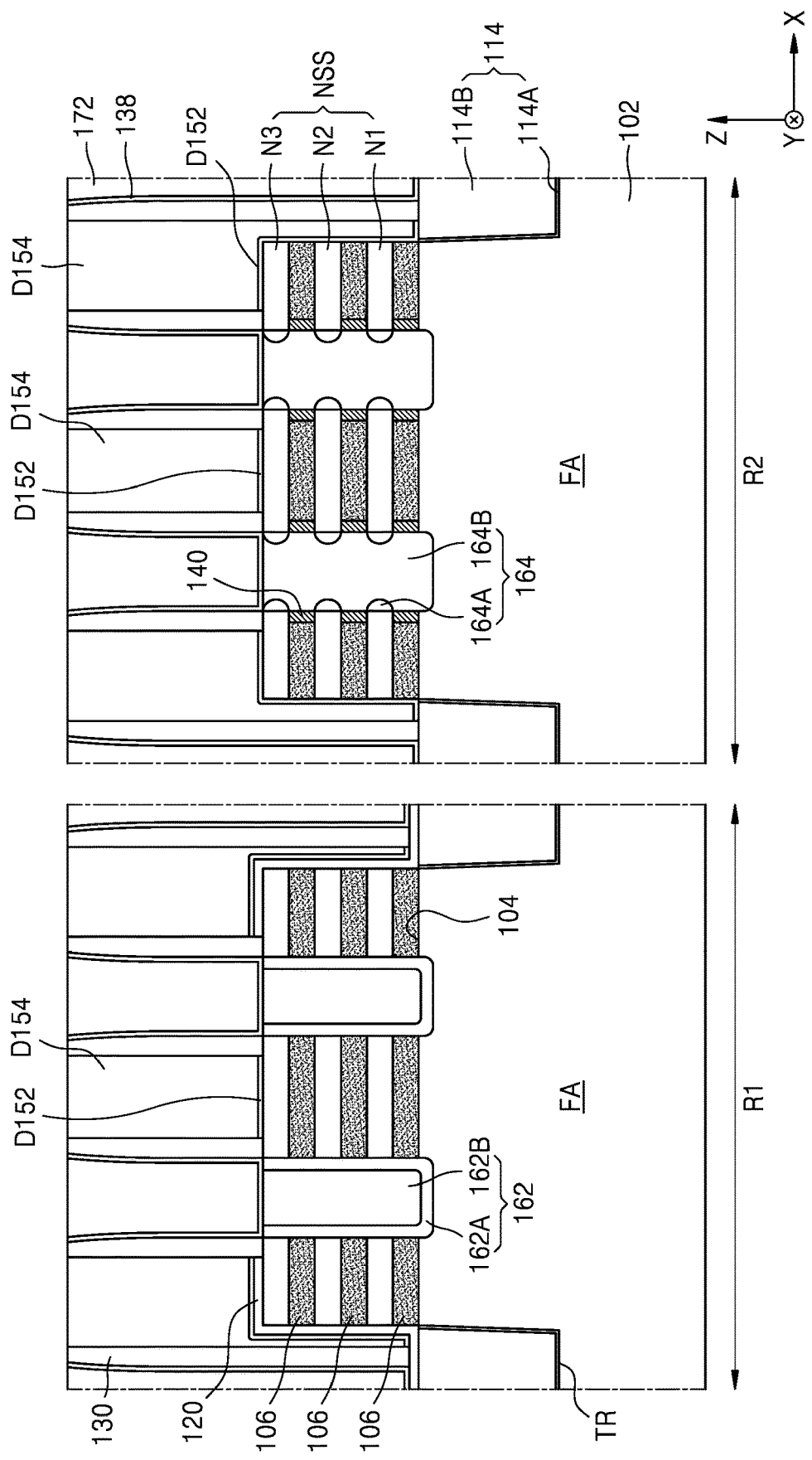

Referring to FIG. 12, a protective film 138 is formed to cover a resultant structure of FIG. 11 in which the first source/drain region 162 and the second source/drain region 164 are formed. For example, the protective film 138 may be formed to conformally cover the gate spacers 130 and upper surfaces of the the first source/drain region 162 and the second source/drain region 164. In some embodiments, the protective film 138 may include a silicon nitride layer. In order to form the protective film 138, an ALD or CVD process may be used. In some embodiments, the protective film 138 may be omitted.

In some embodiments, the portion of the protective film 138 of each of the first region R1 and the second region R2 may be separately formed. For example, after forming the first source/drain region 162, the portion of the protective film 138 in the first region R1 may be formed, then the second source/drain region 164 may be formed, and then the portion of the protective film 138 in the second region R2 may be formed. Alternatively, for example, after forming the second source/drain region 164, the portion of the protective film 138 in the second region R2 may be formed, then the first source/drain region 162 may be formed, and then the portion of the protective film 138 in the first region R1 may be formed.

After forming an inter-gate insulating film 172 on the protective film 138, the inter-gate insulating film 172 is planarized to remove the capping layer D156 (see FIG. 11) covering the upper surface of the dummy gate layer D154. The gate spacer 130, the protective film 138, and the inter-gate insulating film 172 are then polished to remove a part of the thickness thereof from the upper portion thereof so that the upper surface of the inter-gate insulating film 172 is set to be approximately at the same level as the upper surface of the dummy gate layer D154. For example, upper surfaces of the gate spacer 130, the protective film 138, dummy gate layer D154, and the inter-gate insulating film 172 may be at the same vertical level. In some embodiments, the inter-gate insulating film 172 may include a silicon oxide film.

Figure 13:
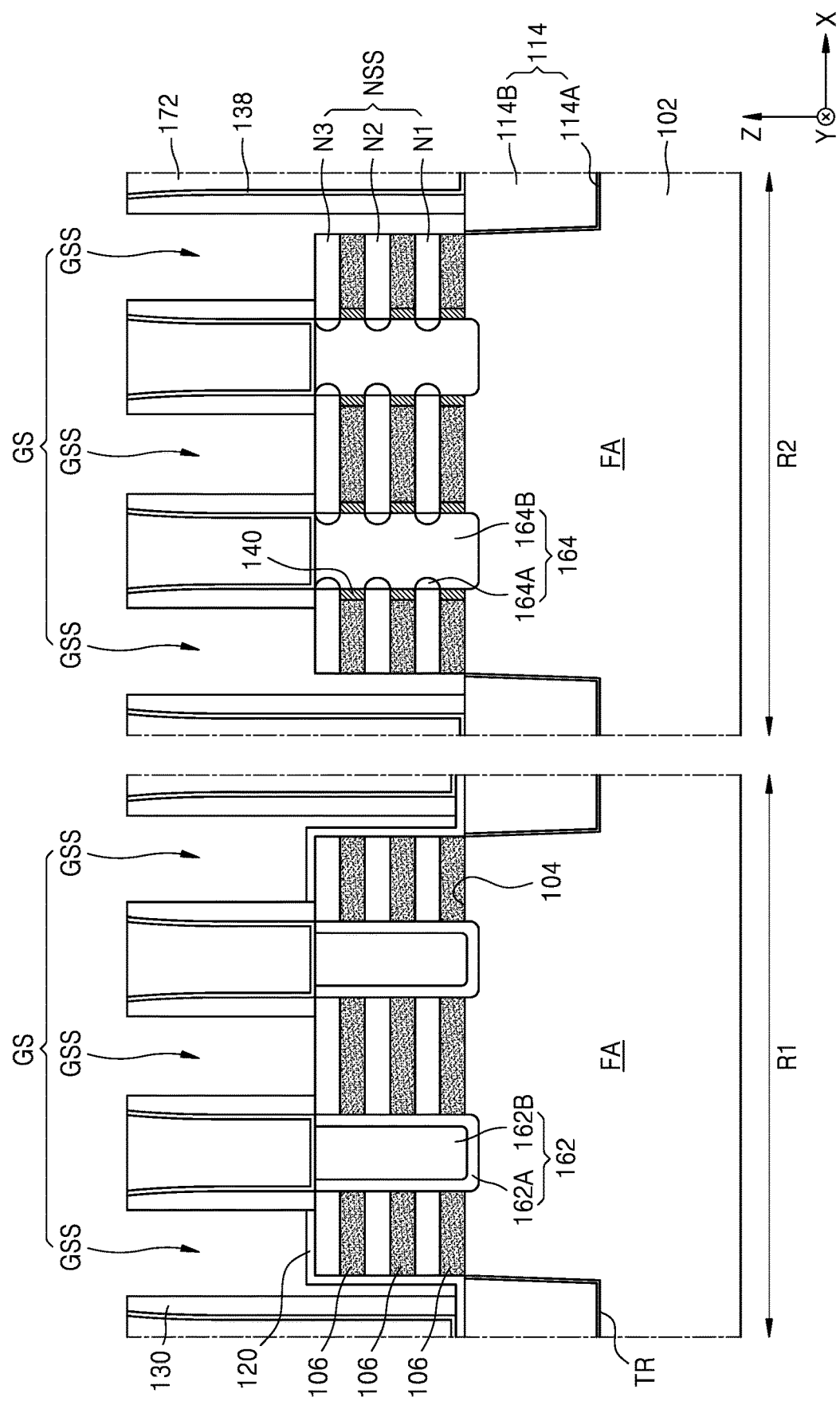
Figure 14:
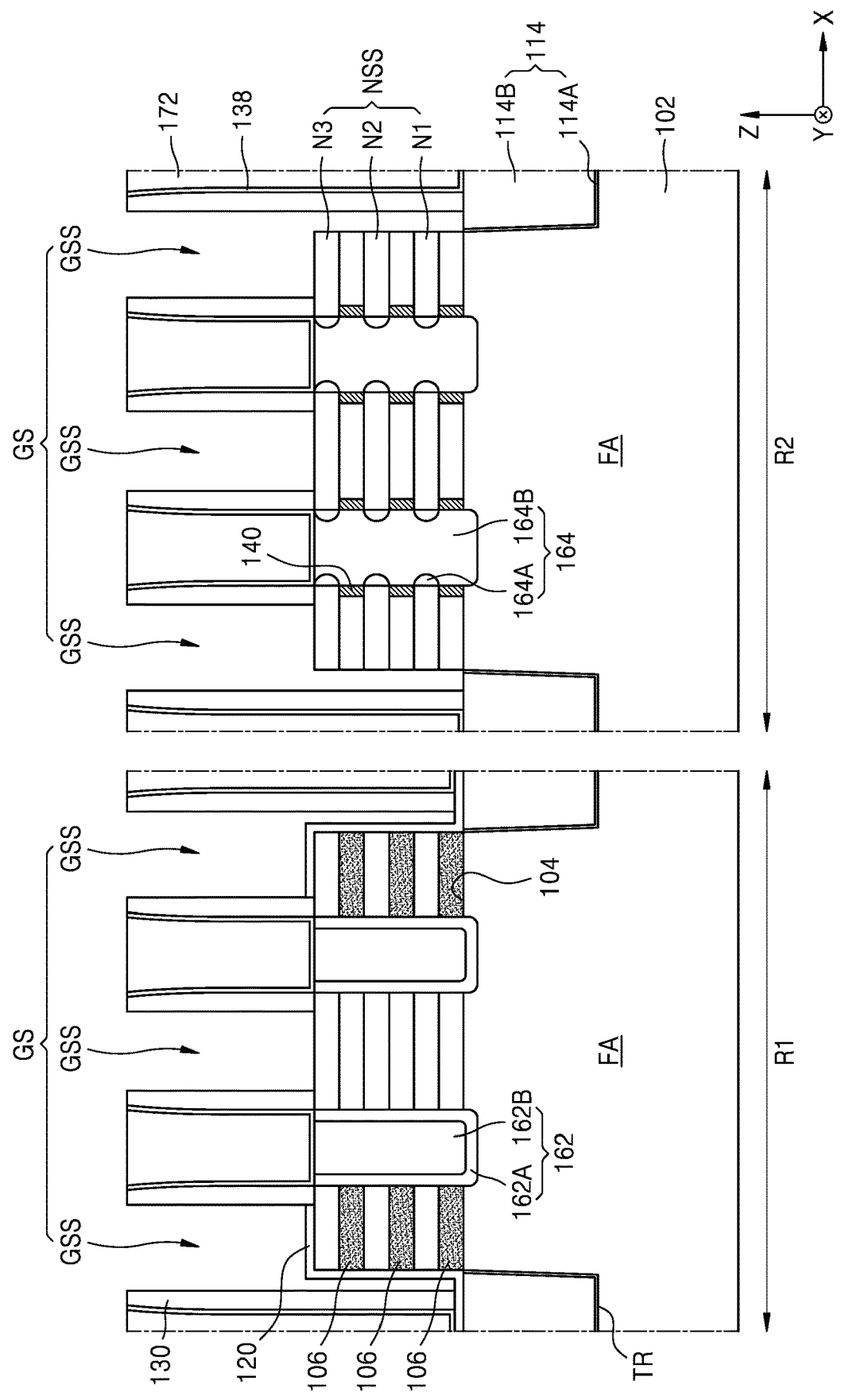
Figure 15:
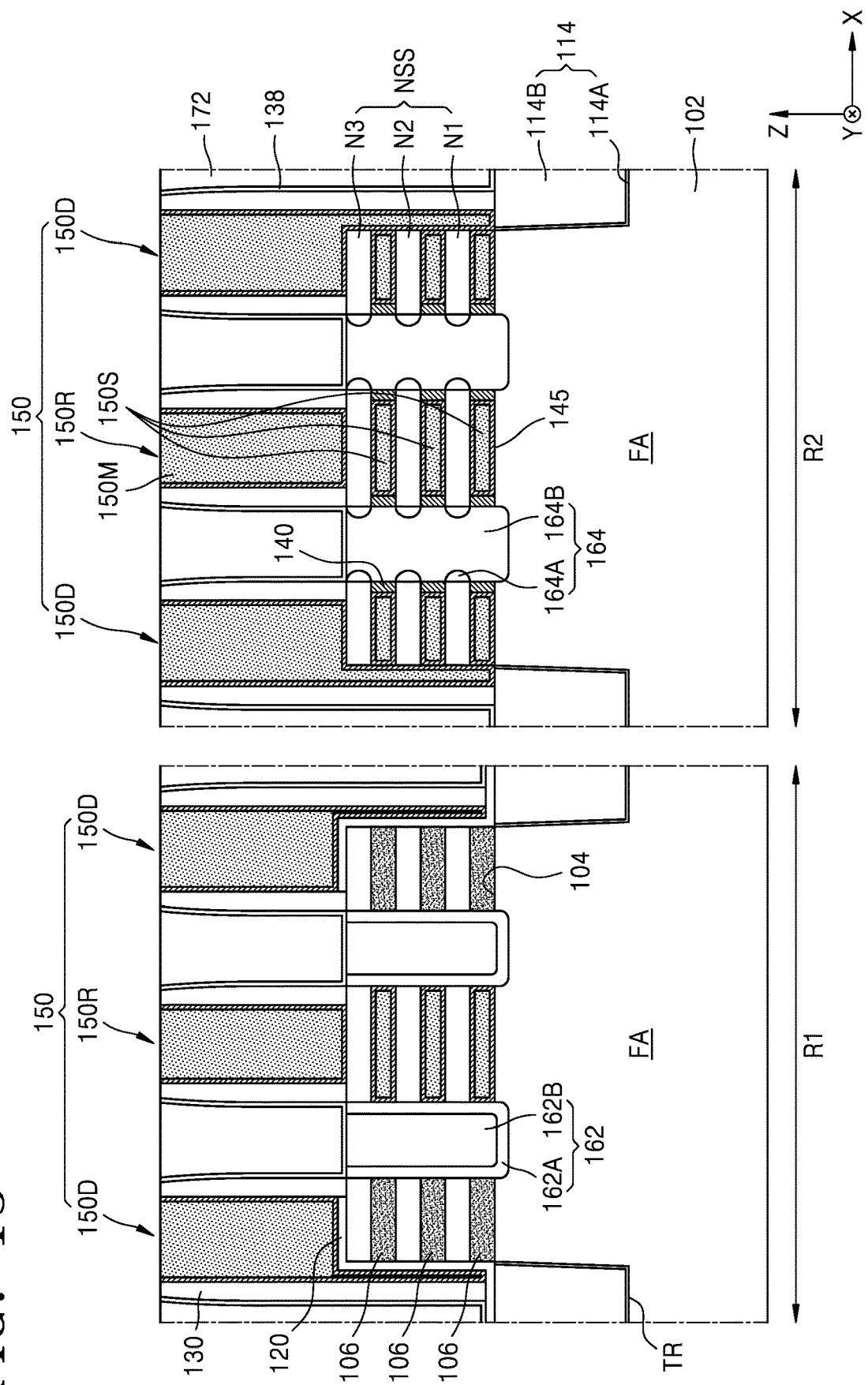

Referring to FIGS. 12 and 13 together, a plurality of gate spaces GS are formed by removing the dummy gate layer D154 exposed through the inter-gate insulating film 172 and the oxide film D152 thereunder.

An edge gate space GSS, which is a part of the gate spaces GS, may be formed by removing the dummy gate layer D154 of the edge dummy gate structure (DGSS of FIG. 11) and the oxide film D152 thereunder. Herein, those gate space GS at locations corresponding to the edge dummy gate structures DGSS are referred to as an edge gate space GSS.

A blocking film 120 is disposed on the bottom surface of the edge gate spaces GSS in the first region R1 so that the surfaces of the plurality of nanosheets N1 and N2 included in the nanosheet stacked structure NSS in the edge gate spaces GSS and the surfaces of the plurality of sacrificial semiconductor patterns 106 may not be exposed. For example, the surfaces of the plurality of nanosheets N1, N2, and N3 and the surfaces of the plurality of sacrificial semiconductor patterns 106 are covered by the blocking film 120 in the edge gate spaces GSS in the first region R1 so that only the gate spacer 130 and the blocking film 120 may be exposed in the edge gate spaces GSS.

Since the blocking film 120 is not disposed in the second region R2, the surfaces of the plurality of nanosheets N1, N2, N3 and the surfaces of the plurality of sacrificial semiconductor patterns 106 may be exposed in the edge gate space GSS in the second region R2.

In the first region R1, the uppermost nanosheet N3 of the nanosheet stacked structure NSS may be exposed through the rest of the plurality of gate spaces GS except for the edge gate spaces GSS. In the second region R2, the uppermost nanosheet N3 of the nanosheet stacked structure NSS may be exposed through the rest of the plurality of gate spaces GS, including the edge gate spaces GSS.

Referring to 13 and 14 together, a part of the plurality of sacrificial semiconductor patterns 106 remaining on the fin-type active area FA is removed through a part of the plurality of gate spaces GS, to thereby expose a part of the surface of each of the plurality of nanosheets N1, N2, and N3, and a part of the upper surface 104 of the fin-type active area FA through the gate spaces GS. Hence, the gate spaces GS may be extended to a portion where the plurality of sacrificial semiconductor patterns 106 are partially removed.

Since the plurality of sacrificial semiconductor patterns 106 are not exposed through the edge gate space GSS covered with the blocking film 120 in the first region R1, the plurality of sacrificial semiconductor patterns 106 at the lower side of the edge gate space GSS are not removed but remain, and the plurality of sacrificial semiconductor patterns 106 at the lower side of the remaining portion of the plurality of gate spaces GS except for the edge gate spaces GSS are removed so that a part of the surface of each of the plurality of nanosheets N1, N2, and N3 and a part of an upper surface 104 of the fin-type active area FA may be exposed through the gate spaces GS. Therefore, in the first region R1, the rest of the plurality of gate spaces GS except for the edge gate spaces GSS may be extended to a portion where a part of the plurality of sacrificial semiconductor patterns 106 is removed.

The sacrificial semiconductor pattern 106 covered with the blocking film 120, which remains by not being removed, may be referred to as a residual semiconductor pattern.

Since there is no blocking film 120 in the second region R2, the sacrificial semiconductor pattern 106 in the lower side of all the gate spaces GS including the edge gate space GSS is removed so that a part of each of the plurality of nanosheets N1, N2, and N3 and a part of the upper surface 104 of the fin-type active area FA may be exposed through the gate space GS. Thus, in the second region R2, the plurality of gate spaces GS may be extended to the portion where a part of the plurality of sacrificial semiconductor patterns 106 is removed. The plurality of insulating spacers 140 may remain on either side of the second source/drain regions 164.

When there is no blocking film 120, in the process of removing the plurality of sacrificial semiconductor patterns 106 in the first region R1, the etchant supplied through the edge gate space GSS, among the plurality of gate spaces GS, is supplied in three directions (Y direction, −Y direction, and one of X direction and −X direction) toward the plurality of sacrificial semiconductor patterns 106, and the etchant supplied through the rest of the plurality of gate spaces GS may be supplied towards the plurality of sacrificial semiconductor patterns 106 in two directions (Y direction and −Y direction). Hence, as the sacrificial semiconductor pattern 106 at a lower side of the edge gate space GSS of the plurality of gate spaces GS is removed earlier than the sacrificial semiconductor pattern 106 at the remaining part of the lower side of the plurality of gate spaces GS, a portion of one side of the first source/drain region 162 facing the edge gate space GSS may be further removed, which is damage. In this case, since the portion of the gate dielectric layer (e.g., gate dielectric layer 145 in FIG. 15) that is in contact with the damaged portion on one side of the first source/drain region 162 may become fragile, a short circuit may occur between the first source/drain region 162 and the gate electrode (e.g., gate electrode 150 of FIG. 15).

However, since the etchant is not supplied to the sacrificial semiconductor pattern 106 at the lower side of the edge gate space GSS due to the blocking film 120 and remains as the residual semiconductor pattern, damage to the first source/drain region 162 may be prevented, thereby preventing a short circuit between the first source/drain region 162 and the gate electrode 150.

On the other hand, since the etchant for removing the sacrificial semiconductor pattern 106 is not supplied to the second source/drain region 164 due to the insulating spacer 140 in the second region R2, the second source/drain region 164 may not be damaged even when the blocking film 120 is not disposed.

Referring to 14 and 15 together, after removing the native oxide film from the exposed surfaces of the plurality of nanosheets N1, N2, and N3 and the fin-type active area FA, the gate dielectric layer 145 is formed on the surfaces exposed in the plurality of gate spaces GS, and a plurality of gate electrodes 150 are formed on the gate dielectric layer 145, which fills the plurality of gate spaces GS.

The gate dielectric layer 145 may have a stacked structure of an interfacial layer and a high-k dielectric layer. The interfacial layer may heal an interface defect with the high-k dielectric layer on the upper surface of the fin-type active area FA and the surfaces of the plurality of nanosheets N1, N2, and N3. In some embodiments, the interfacial layer may include a low dielectric material layer having a dielectric constant of about 9 or less, such as a silicon oxide film, a silicon oxynitride film, or a combination thereof. In some other embodiments, the interfacial layer may include silicate, a combination of silicate and a silicon oxide film, or a combination of a silicate and a silicon oxynitride film. In some embodiments, the interfacial layer may be omitted. The high-k dielectric layer may be made of a material having a dielectric constant greater than that of the silicon oxide film. For example, the high-k dielectric layer may have a dielectric constant of about 10 to 25. The high-k dielectric layer may be formed by atomic layer deposition (ALD), chemical vapor deposition (CVD), or physical vapor deposition (PVD). The high-k dielectric layer may have a thickness of about 10 to 40 Å, but the present disclosure is not limited to this example.

The gate electrode 150 may include a metal-containing layer for controlling the work function and a metal-containing layer for filling the upper space of the metal-containing layer for controlling the work function. In some embodiments, the gate electrode 150 may have a structure in which a metal nitride layer, a metal layer, a conductive capping layer, and a gap-fill metal layer are sequentially stacked. The metal nitride layer and the metal layer may be formed by ALD, metal organic ALD (MOALD), or metal organic CVD (MOCVD) process, respectively. The conductive capping layer may serve as a protective film for preventing the surface of the metal layer from being oxidized. In addition, the conductive capping layer may serve as a wetting layer for facilitating deposition when another conductive layer is deposited on the metal layer. The gap-fill metal layer may extend over the conductive capping layer. The gap fill metal layer may be formed by an ALD, CVD, or PVD process. In some embodiments, the gate electrode 150 may have a stacked structure of TiAlC/TiN/W, a stacked structure of TiN/TaN/TiAlC/TiN/W, or a stacked structure of TiN/TaN/TiN/TiAlC/TiN/W. In the above stacked structures, a TiAlC layer or a TiN layer may serve as a metal-containing layer for controlling a work function.

In some embodiments, the portion of the gate electrode 150 formed in each of the first region R1 and the second region R2 may have a different stacking structure. For example, in the portion of the gate electrode 150 formed in each of the first region R1 and the second region R2, the metal for controlling the work function may be made of another material.

The gate electrode 150 may include a main gate portion 150M covering the upper surface of the nanosheet stacked structure NS S including the plurality of nanosheets N1, N2, and N3, and a plurality of sub-gate portions 150S formed in a space between each of the nanosheets N1, N2, and N3 and the fin-type active area FA. The horizontal length of each of the plurality of sub-gate portions 150S may have the same value as the horizontal length of the main gate portion 150M. In some embodiments, the horizontal length of each of the plurality of sub-gate portions 150S may be greater or less than the horizontal length of the main gate portion 150M. The gate dielectric layer 145 may surround the plurality of sub-gate portions 150S, respectively, and the gate dielectric layer 145 may cover bottom and side surfaces of the main gate portion 150M.

The plurality of gate electrodes 150 may include a dummy gate electrode 150D filling the edge gate space GSS of the plurality of gate spaces GS, and a real gate electrode 150R filling a remaining portion of the plurality of gate spaces GS except for the edge gate space GSS. In some embodiments, dummy gate electrodes in memory devices are not effective to cause transmission of data to external devices. For instance, a dummy gate electrode may not be electrically connected to gates of memory cells, or if a dummy gate electrode is electrically connected to gates of dummy memory cells, such dummy gate electrode may not be activated or if activated, may not result in communication of any data in such dummy memory cells to a source external to the memory device.

In the first region R1, the plurality of sub-gate portions 150S are formed in the portion where the plurality of sacrificial semiconductor patterns 106 are removed so that the dummy gate electrode 150D includes only the main gate portion 150M and may not include the plurality of sub-gate portions 150S.

On the other hand, in the second region R2, the dummy gate electrode 150D may include the main gate portion 150M and the plurality of sub-gate portions 150S.

In the second region R2, a plurality of insulating spacers 140 may be disposed on both ends of each of the plurality of sub-gate portions 150S of the real gate electrode 150R with a gate dielectric layer 145 therebetween. Thus, the insulating spacers 140 may cover both sidewalls of each of the plurality of sub-gate portions 150S with the gate dielectric layer 145 therebetween.

In some embodiments, in the second region R2, the plurality of insulating spacers 140 may be disposed on one end of each of the plurality of sub-gate portions 150S of the dummy gate electrode 150D with the gate dielectric layer 145 therebetween. Thus, the insulating spacers 140 may cover one sidewall of each of the plurality of sub-gate portions 150S of the dummy gate electrode 150D, specifically, one sidewall nearest the real gate electrode 150R with the gate dielectric layer 145 therebetween.

In the first region R1, the insulating spacers 140 may not be disposed on both ends of each of the plurality of sub-gate portions 150S of the real gate electrode 150R.

Figure 16:
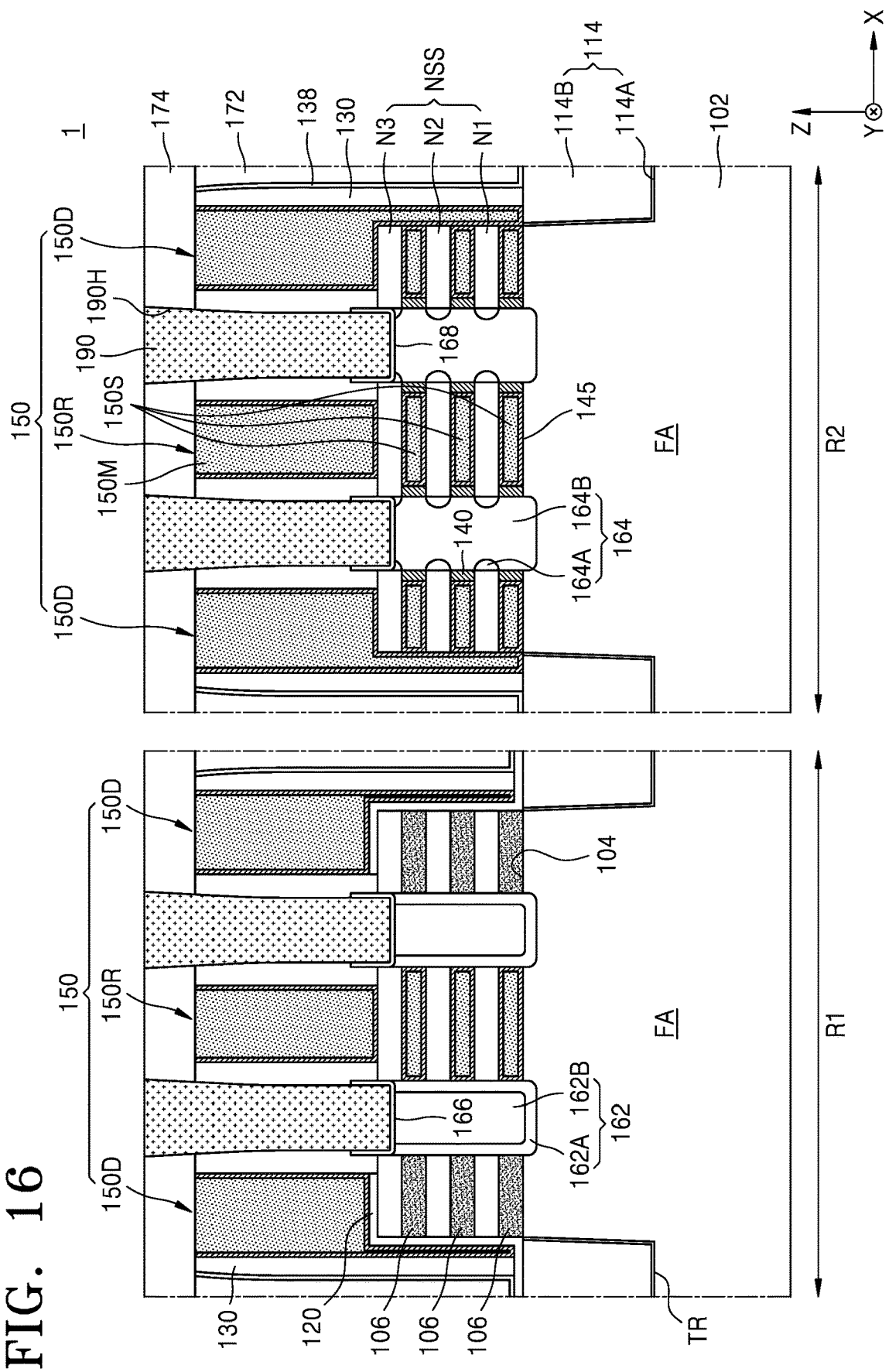

Referring to FIG. 16, after forming an inter-layer insulating film 174 covering the gate electrode 150 and the inter-gate insulating film 172, the inter-layer insulating film 174 and the inter-gate insulating film 172 are partially etched to form a plurality of contact holes 190H which expose the first source/drain region 162 and the plurality of second source/drain regions 164 in the first region R1 and the second region R2, respectively. Thereafter, a first metal silicide film 166 and a second metal silicide film 168 are formed on the upper surfaces of the plurality of first source/drain regions 162 and the upper surfaces of the plurality of second source/drain regions 164 which are exposed through the plurality of contact holes 190H. In some embodiments, the first metal silicide film 166 and the second metal silicide film 168 may be made of titanium silicide, but the present disclosure is not limited to this example.

Thereafter, a plurality of contact plugs 190, which fill the plurality of contact holes 190H, are formed to form a semiconductor device 1. The contact plugs 190 in the first region R1 may be connected to the first source/drain region 162 through the first metal silicide film 166, and the contact plugs 190 in the second region R2 may be connected to the second source/drain region 164 through the second metal silicide film 168. The first metal silicide film 166 and the second metal silicide film 168 may cover lower side and bottom surfaces of the contact plugs 190.

The semiconductor device 1 includes a fin-type active area FA protruding from the substrate 102 and extending lengthwise in a first direction (X direction), and a plurality of nanosheet stacking structures NSS facing the upper surface 104 of the fin-type active area FA at a position spaced above the upper surface 104 of the fin-type active area FA. A trench TR limiting the fin-type active area FA may be formed in the substrate 102. As used herein, an item, layer, or portion of an item or layer described as extending "lengthwise" in a particular direction has a length in the particular direction and a width perpendicular to that direction, where the length is greater than the width.

The bottom sidewalls of the fin-type active area FA may be covered with the device isolation film 114 filling the trench TR, respectively. The device isolation film 114 may include an insulating liner 114A that conformally covers the inner wall of the trench TR, and a gap fill insulating film 114B on the insulating liner 114A and filling the trench TR. The level of the upper surface 104 of the fin-type active area FA and the level of the upper surface of the device isolation film 114 may be the same or similar to each other. For example, the level of the upper surface 104 of the fin-type active area FA and the level of the upper surface of the device isolation film 114 may be substantially the same.

The plurality of nanosheets stacked structures NSS are spaced in the Z direction from the upper surface 104 of the fin-type active area FA. The plurality of nanosheet stack structures NSS may include a plurality of nanosheets N1, N2, and N3 extending on the substrate 102 in parallel in the X and Y directions with the upper surface of the fin-type active area FA.

The plurality of nanosheets N1, N2, and N3 constituting one nanosheet stacked structure NSS is sequentially stacked on the upper surface 104 of the fin-type active area FA one by one. It is illustrated in the present example that one nanosheet stacked structure NSS includes three nanosheets N1, N2, and N3, but the technical idea of the present disclosure is not limited to the illustrated example. For example, each of the plurality of nanosheets N1, N2, and N3 may include one nanosheet, or may include a plurality of nanosheets that are variously selected as needed. Each of the plurality of nanosheets N1, N2, and N3 may have a channel region.

In the first region R1, the blocking film 120 may cover a part of the upper surface and one sidewall of each of a pair of nanosheet stacked structures NSS adjacent to both sides of the fin-type active area FA among the plurality of nanosheet stacked structures NSS. In the first region R1, a plurality of sacrificial semiconductor patterns 106, namely, a plurality of residual semiconductor patterns, may be disposed between the fin-type active area FA and each of the plurality of nanosheets N1, N2, and N3 included in a pair of nanosheet stacked structures NSS adjacent to both sides of the fin-type active area FA among the plurality of nanosheet stacked structures NSS.

A plurality of gate electrodes 150 extend lengthwise in a second direction (Y direction) intersecting the first direction on the fin-type active area FA. The plurality of gate electrodes 150 may overlap with at least a part of each of the plurality of nanosheet stack structures NSS in the vertical direction (Z direction).

The real gate electrode 150R in the first region R1, and each of the real gate electrode 150R and the dummy gate electrode 150D in the second region R2 among the plurality of gate electrodes 150 may be formed to surround at least a part of the plurality of nanosheets N1, N2, and N3 while covering the nanosheet stacked structure NSS. The gate electrode 150 may include a main gate portion 150M covering the upper surface of the nanosheet stacked structure NSS and a plurality of sub-gate portions 150S which are connected to the main gate portion 150M and are formed at a space between the fin-type active area FA and the plurality of nanosheets N1, N2, and N3, namely, at the lower side of each of the plurality of nanosheets N1, N2, and N3. The second thickness, which is the thickness of each of the plurality of sub-gate portions 150S, may be less than the first thickness, which is the thickness of the main gate portion 150M. Here, the first thickness of the main gate portion 150M and the second thickness of each of the plurality of sub-gate portions 150S refer to a size in the Z direction, respectively.

The length of each of the plurality of sub-gate portions 150S may have the same value as the length of the main gate portion 150M. In some embodiments, the horizontal length of each of the plurality of sub-gate portions 150S may be greater or less than the horizontal length of the main gate portion 150M. Here, the length of the plurality of sub-gate portions 150S and the length of the main gate portion 150M each refers to a length in the X direction.

A gate dielectric layer 145 is formed between the nanosheet stacked structure NSS and the gate electrode 150.

The dummy gate electrode 150D of the first region R1 among the plurality of gate electrodes 150 may include only the main gate portion 150M and may not include the sub-gate portion 150S. The dummy gate electrode 150D in the first region R1 among the plurality of gate electrodes 150 may be disposed on the blocking film 120.

The dummy gate electrode 150D in the first region R1 may be spaced apart from the nanosheet stacked structure NSS and the plurality of residual semiconductor patterns 106 with the blocking film 120 and the gate dielectric layer 145 therebetween, and the gate dielectric layer 145 in contact with the dummy gate electrode 150D in the first region R1 may be spaced apart from the nanosheet stacked structure NSS and the plurality of residual semiconductor patterns 106 with the blocking film 120 therebetween.

The real gate electrode 150R in the first region R1, and each of the real gate electrodes 150R and the dummy gate electrode 150D in the second region R2 may be spaced apart from the nanosheet stacked structure NSS with the gate dielectric layer 145 therebetween, and the real gate electrode 150R of the first region R1, and each of the real gate electrodes 150R and the dummy gate electrode 150D in the second region R2 may be electrically connected to the plurality of nanosheets N1, N2, and N3 included in the nanosheet stacked structure NSS. As used herein, items described as being "electrically connected" are configured such that an electrical signal can be passed from one item to the other.

In some embodiments, the plurality of nanosheets N1, N2, and N3 may be made of a single material. In some embodiments, the plurality of nanosheets N1, N2, and N3 may be made of the same material as the constituent material of the substrate 102.

A plurality of first source/drain regions 162 and a plurality of second source/drain regions 164 are formed on the fin-type active area FA in the first region R1 and the second region R2, respectively. The plurality of first source/drain regions 162 and the plurality of second source/drain regions 164 are connected to one end of a plurality of neighboring nanosheets N1, N2, and N3, respectively.

The first source/drain region 162 may include a first cover layer 162A and a first buried layer 162B. The first cover layer 162A may be formed in the first region R1 in order to cover sidewalls of the plurality of nanosheets N1, N2, and N3, sidewalls of the plurality of residual semiconductor patterns, a part of the fin-type active area FA, and a part of the gate dielectric layer 145, and the first buried layer 162B may be formed on the first cover layer 162A in the first region R1 to fill a space between the plurality of nanosheet stacked structures NSS.

The second source/drain region 164 may include a second cover layer 164A and a second buried layer 164B. The second cover layer 164A may be formed to cover the exposed sidewalls of the plurality of nanosheets N1, N2, and N3 in the second region R2, and the second buried layer 164B may be formed on the second cover layer 164A in the second region R2 to fill a space between the plurality of nanosheet stacked structures NSS.

One first source/drain region 162 may include a first cover layer 162A that extends as one body on the sidewall of each of the plurality of nanosheets N1, N2, and N3, and one second source/drain region 164 may include a plurality of second cover layers 164A that are in contact with and spaced from the sidewall of each of the plurality of nanosheets N1, N2, and N3.

The first cover layer 162A may be made of a material different from the residual semiconductor pattern. The first cover layer 162A may be made of a semiconductor material including Ge, and the residual semiconductor pattern may be made of a semiconductor material including Ge.

A first metal silicide film 166 and a second metal silicide film 168 may be formed on the plurality of first source/drain regions 162 and the plurality of second source/drain regions 164, respectively. In some embodiments, the first metal silicide film 166 and the second metal silicide film 168 may be omitted.

A gate spacer 130 and a protective film 138 are formed on the plurality of nanosheets stacked structures NSS in order to cover the sidewalls of the gate electrode 150 in order. The gate spacer 130 and the protective film 138 may include a silicon nitride layer, but the present disclosure is not limited this example. In some embodiments, the protective film 138 may be omitted.

The gate spacer 130 and the protective film 138 may cover the sidewalls of the main gate portion 150M of the gate electrodes 150. In some embodiments, the protective film 138 may cover a portion of the upper surface of the plurality of first source/drain regions 162 and the plurality of second source/drain regions 164.

An insulating spacer 140 in contact with the second source/drain region 164 is formed in a space between the plurality of respective nanosheets N1, N2, and N3 in the second region R2. The insulating spacer 140 may be between the sub-gate portion 150S and the second source/drain region 164 in the space between the fin-type active area FA and each of the plurality of nanosheets N1, N2, and N3. In some embodiments, the insulating spacers 140 may include a silicon nitride film. The insulating spacers 140 may cover at least a part of the plurality of sub-gate portions 150S with the gate dielectric layer 145 therebetween.

An inter-gate insulating film 172 and an inter-layer insulating film 174 are sequentially formed on the plurality of first source/drain regions 162 and the plurality of second source/drain regions 164. The inter-gate insulating film 172 and the inter-layer insulating film 174 may include a silicon oxide film, but the present disclosure is not limited to this example.

The contact plugs 190 may be connected to the plurality of first source/drain regions 162 and the plurality of second source/drain regions 164, respectively. The contact plugs 190 may penetrate the inter-layer insulating film 174, the inter-gate insulating film 172, and the protective film 138, to thereby be connected to the plurality of first source/drain regions 162 and the plurality of second source/drain regions 164, respectively. The first metal silicide layer 166 may be between the first source/drain region 162 and the contact plug 190. The second metal silicide film 168 may be between the second source/drain region 164 and the contact plug 190. The contact plugs 190 may be formed of a metal, a conductive metal nitride, or a combination thereof. For example, the contact plug 190 may be formed of W, Cu, Al, Ti, Ta, TiN, TaN, an alloy thereof, or a combination thereof, but the technical idea of the present disclosure is limited to the illustrated examples.

Since the semiconductor device 1 according to the present disclosure has a blocking film 120, in the first region R1, for preventing the first source/drain region 162 from being damaged in the process of forming the gate electrode 150, particularly, the sub-gate portion 150S, a short circuit between the first source/drain region 162 and the gate electrode 150 may be prevented, and since the semiconductor device 1 includes the insulating spacer 140 in the second region, a short circuit between the second source/drain region 164 and the gate electrode 150 may be prevented, thereby ensuring reliability.

FIGS. 17 to 23 are cross-sectional views illustrating a method of manufacturing a semiconductor device, according to embodiments of the present disclosure, and a semiconductor device manufactured by the method, according to a process order. Specifically, FIGS. 17 to 23 are cross-sectional views taken along the X-Z plane about the operations after the operations of FIGS. 5A and 5B, and the points that have already been explained with reference to FIGS. 1 to 16 will be omitted in the description of FIGS. 17 to 23.

Figure 17:
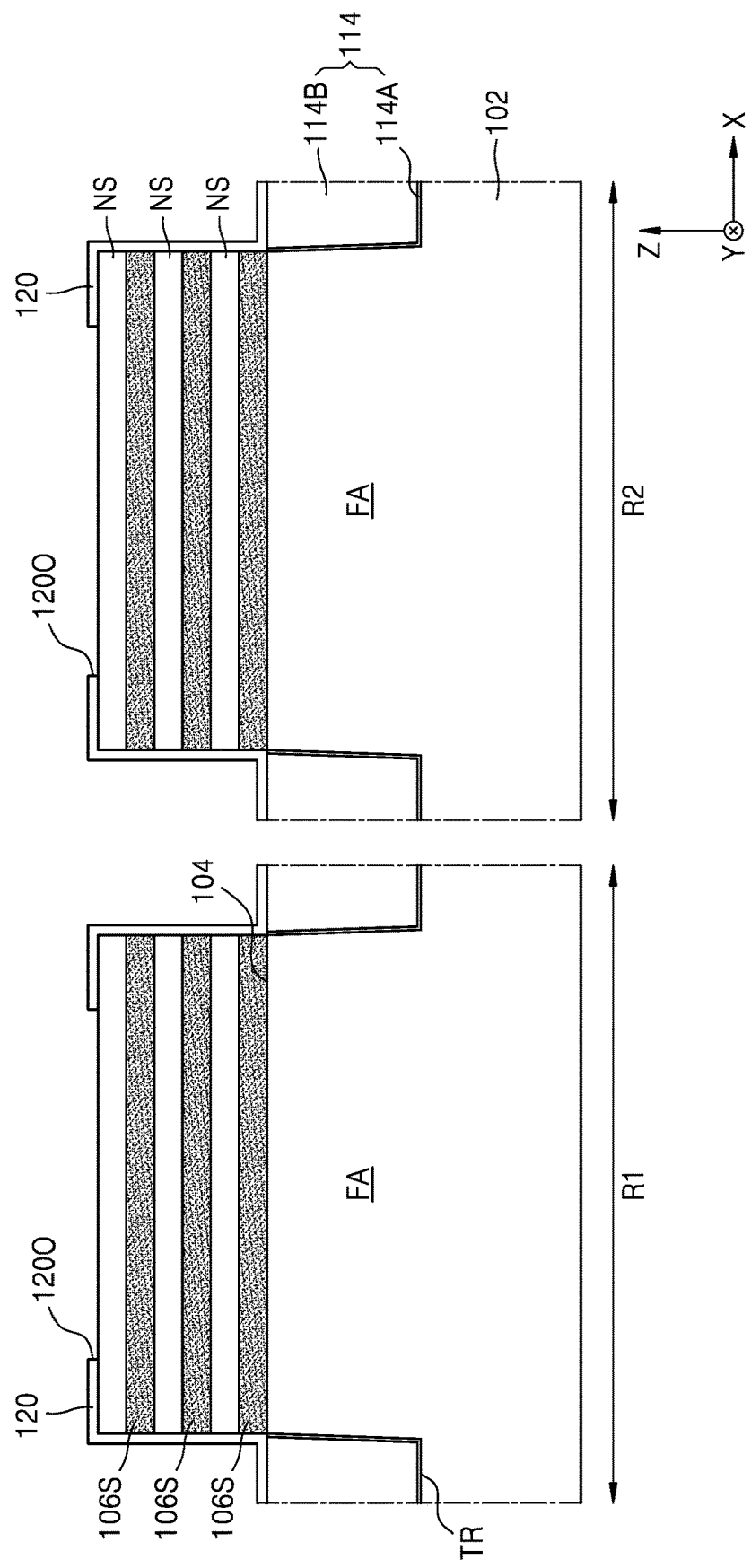
FIGS. 17 to 23 are cross-sectional views illustrating a method of manufacturing a semiconductor device, according to exemplary embodiments of the present disclosure, and a semiconductor device manufactured by the method, according to a process order.

Referring to FIG. 17, a blocking film 120 is formed on each of the first region R1 and the second region R2 to cover a part of the upper surface of the stacked structure of the plurality of sacrificial semiconductor layers 106S and the plurality of nanosheet semiconductor layers NS and the sidewalls. The blocking film 120 may have an opening 120O exposing the remaining part of the upper surface of the stacked structure SS of the plurality of sacrificial semiconductor layers 106S and the plurality of nanosheet semiconductor layers NS. The opening 120O of the blocking film 120 may cover a part of the upper surface of the uppermost nanosheet semiconductor layer NS among the plurality of nanosheet semiconductor layers NS while not covering the remaining part of the upper surface of the uppermost nanosheet semiconductor layer NS. The blocking film 120 in each of the first region R1 and the second region R2 may cover a part of the upper surface of the stacked structure SS and the upper surface of the device isolation film 114 together with the sidewall.

Figure 18:
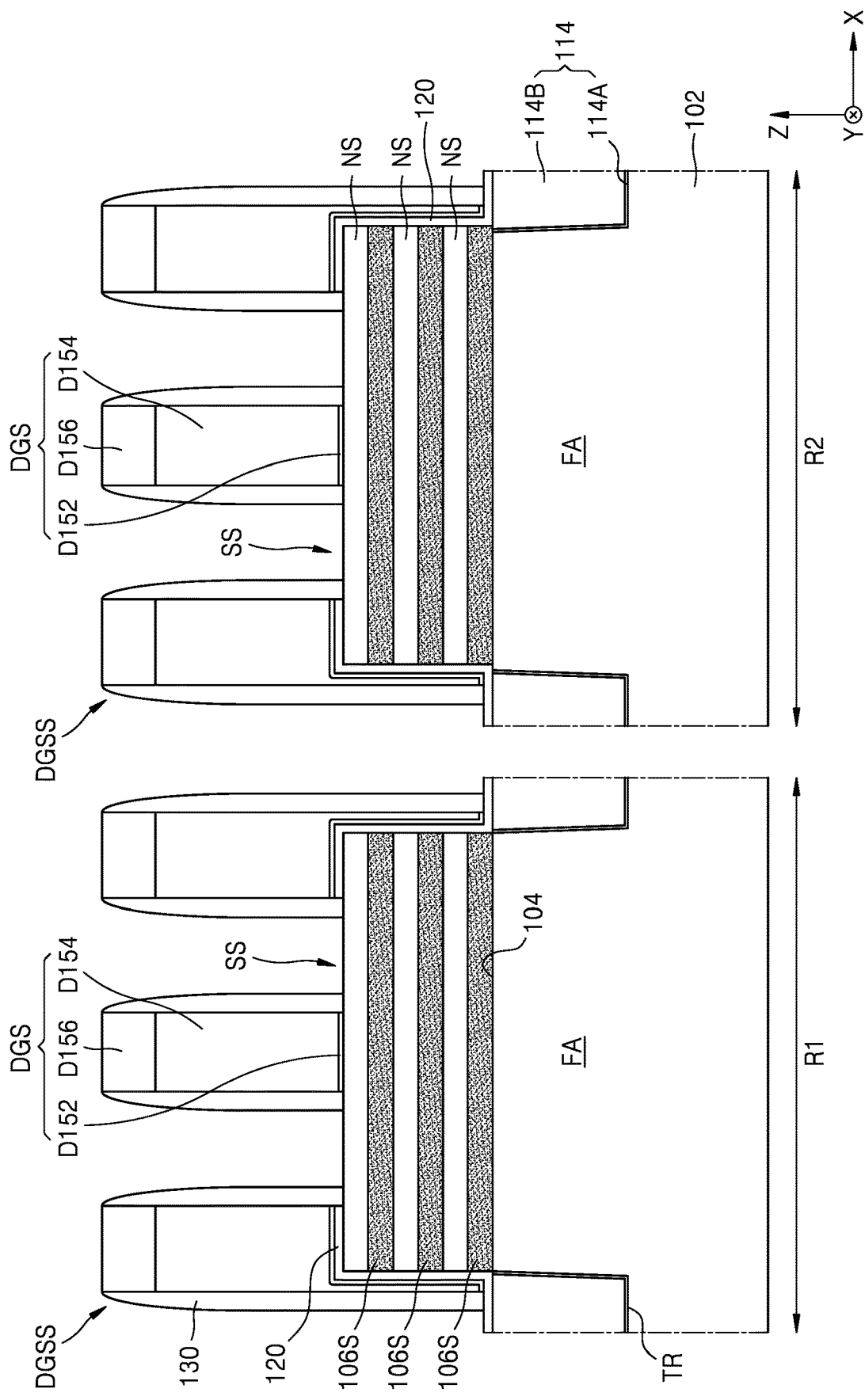

Referring to FIG. 18, at least one dummy gate structure (DGS) extending lengthwise across at least a portion of the plurality of fin-type active areas FA are formed on the fin-type active area FA where the stacked structure of the plurality of sacrificial semiconductor layers 106S and the plurality of nanosheet semiconductor layers NS is formed, and a gate spacer 130 covering both sidewalls of the dummy gate structure DGS is formed in each of the first region R1 and the second region R2. The dummy gate structure (DGS) may have a structure in which an oxide film D152, a dummy gate layer D154, and a capping layer D156 are sequentially stacked.

In each of the first region R1 and the second region R2, the oxide film D152 and the dummy gate layer D154 of the edge dummy gate structure DGSS may be overlapped with the blocking film 120 in the vertical direction (Z direction). In each of the first region R1 and the second region R2, a blocking film 120 is between the oxide film D152 of the edge dummy gate structure DGSS and the upper surface and sidewalls of the stacked structure SS so that the edge dummy gate structure DGSS and the stacked structure may be spaced apart from each other with the blocking film 120 therebetween.

Figure 19:
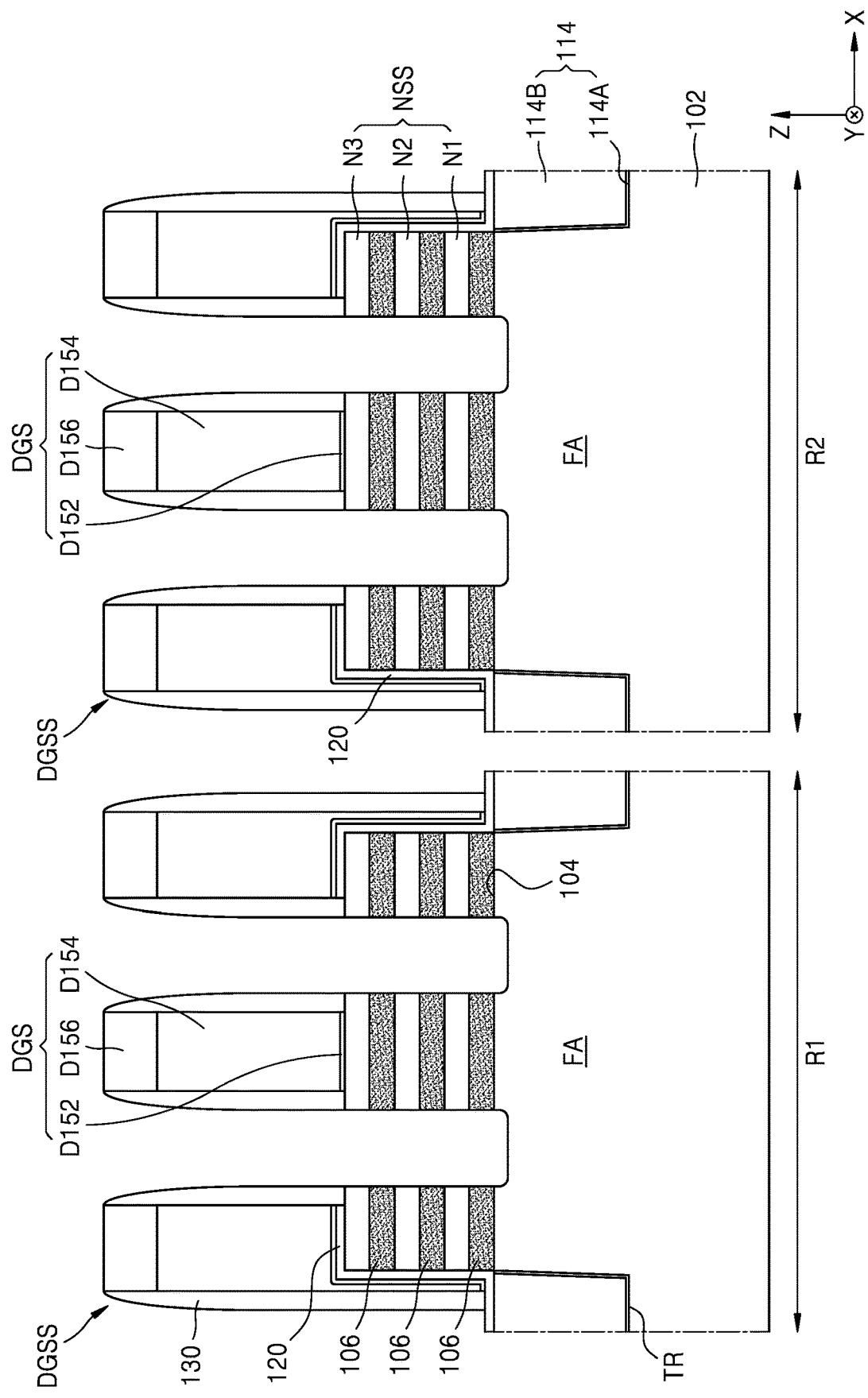

Referring to FIGS. 18 and 19, a plurality of nanosheet stacked structures NSS including a plurality of nanosheets N1, N2 and N3 are formed from the plurality of nanosheet semiconductor layers NS by removing a part of the stacked structure of the plurality of sacrificial semiconductor layers 106S and the plurality of nanosheet semiconductor layers NS by using the dummy gate structure DGS and the gate spacer 130 as an etching mask, and a plurality of sacrificial semiconductor patterns 106 are formed from the plurality of sacrificial semiconductor layers 106S.

Figure 20:
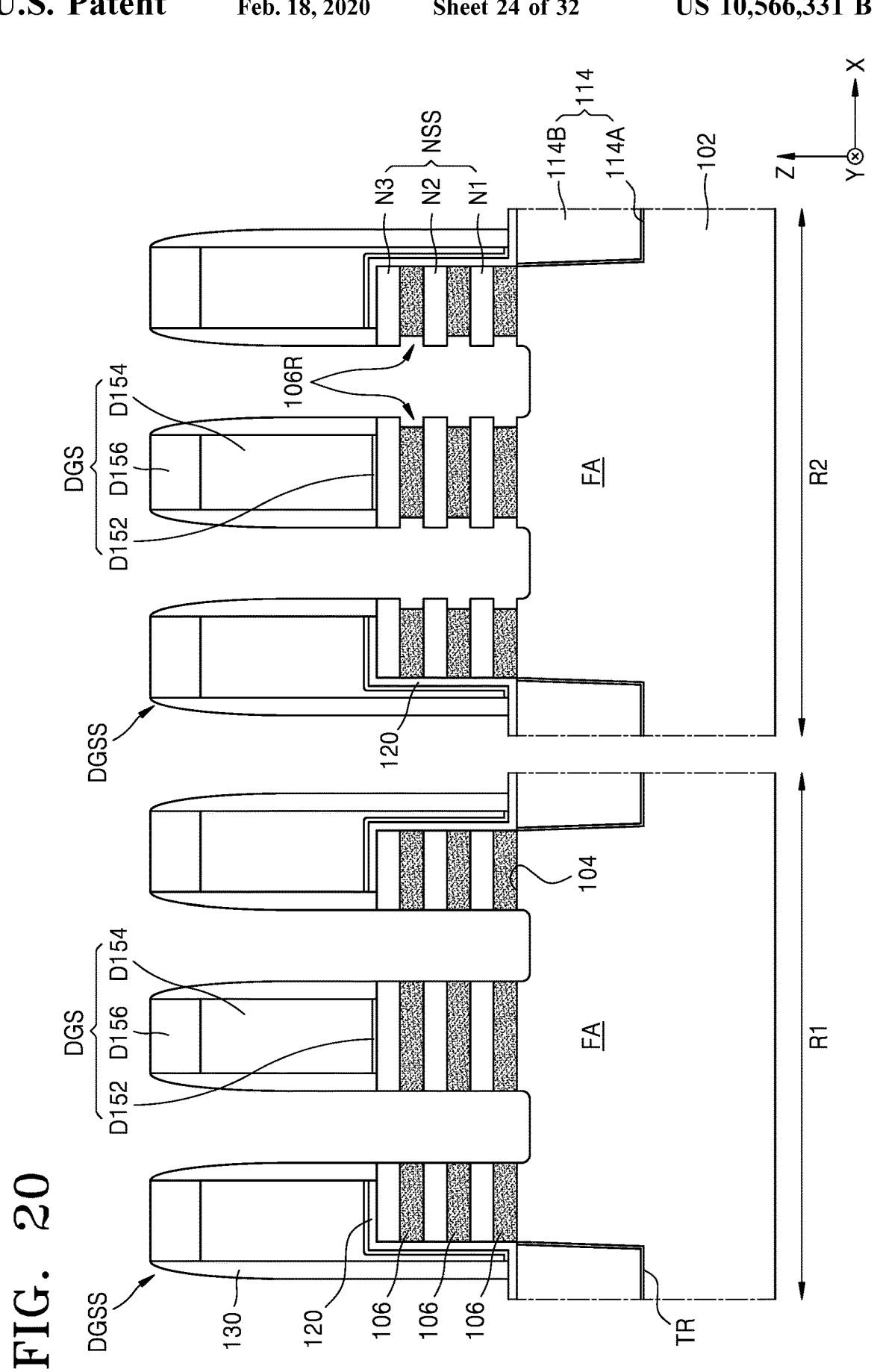

Referring to FIG. 20, recess regions 106R are formed between the plurality of respective nanosheets N1, N2, and N3 by removing a part of the plurality of sacrificial semiconductor patterns 106 exposed on both sides of each of the plurality of nanosheet stacked structures NSS by using an isotropic etching process for the second region R2.

Figure 21:
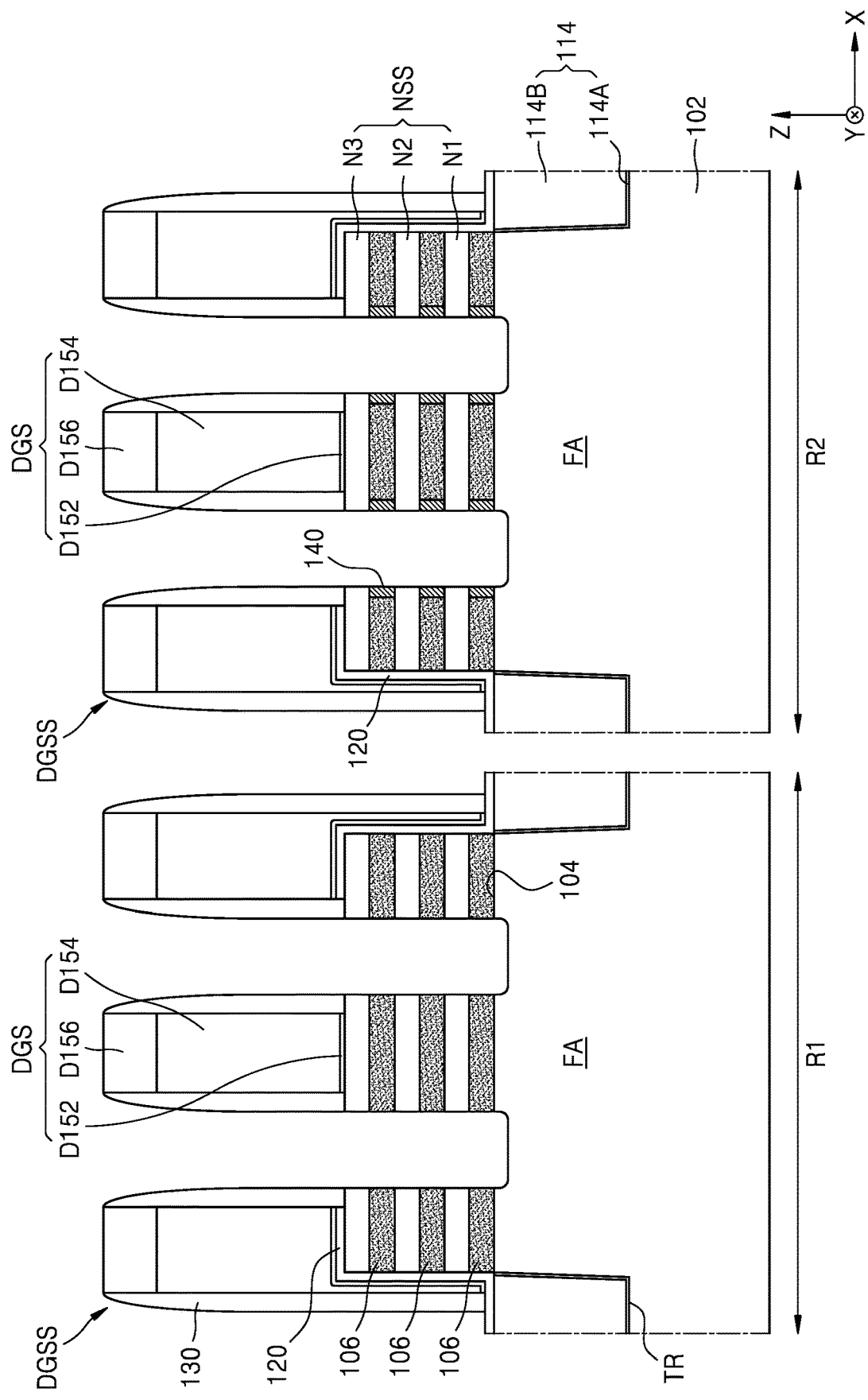

Referring to FIGS. 20 and 21, insulating spacers 140 are formed in the second region R2 to fill the recess regions 106R formed between the plurality of respective nanosheets N1, N2, and N3.

Figure 22:
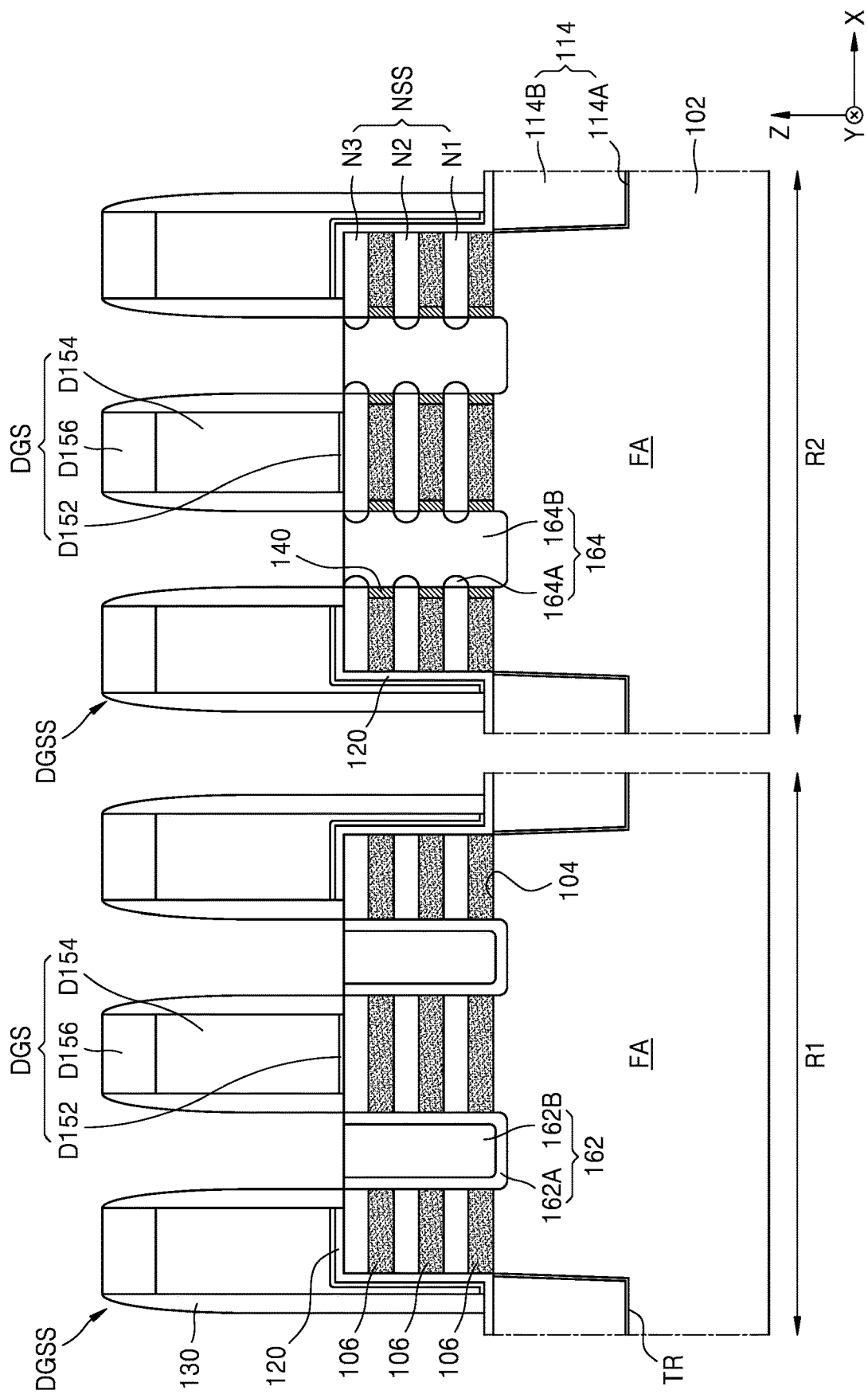

Referring to FIG. 22, the sidewalls of the plurality of nanosheets N1, N2, and N3 and the surface of the fin-type active area FA exposed between the respective nanosheet stacked structures NSS are exposed to a cleaning atmosphere to thereby remove a native oxide film from the exposed surfaces.

Thereafter, in the first region R1, a first source/drain region 162 is formed by allowing a semiconductor material to be epitaxially grown from both exposed sidewalls of the plurality of nanosheets N1, N2, and N3 and the exposed surface of the fin-type active area FA, and, in the second region R2, a second source/drain region 164 is formed by allowing a semiconductor material to be epitaxially grown from both exposed sidewalls of the plurality of nanosheets N1, N2, and N3 and the exposed surface of the fin-type active area FA.

The first source/drain region 162 may include a first cover layer 162A and a first buried layer 162B. The first cover layer 162A may be formed in the first region R1 in order to cover exposed both sidewalls of the plurality of nanosheets N1, N2, and N3, both sidewalls of the plurality of sacrificial semiconductor patterns 106, and the exposed surface of the fin-type active area FA, and the first buried layer 162B may be formed to fill a space between the plurality of nanosheet stacked structures NSS on the first cover layer 162A in the first region R1.

The second source/drain region 164 may include a second cover layer 164A and a second buried layer 164B. The second cover layer 164A may be formed to cover the exposed both sidewalls of the plurality of nanosheets N1, N2, and N3 in the second region R2, and the second buried layer 164B may be formed to fill a space between the plurality of nanosheet stacked structures NSS on the second cover layer 164A in the second region R2.

Figure 23:
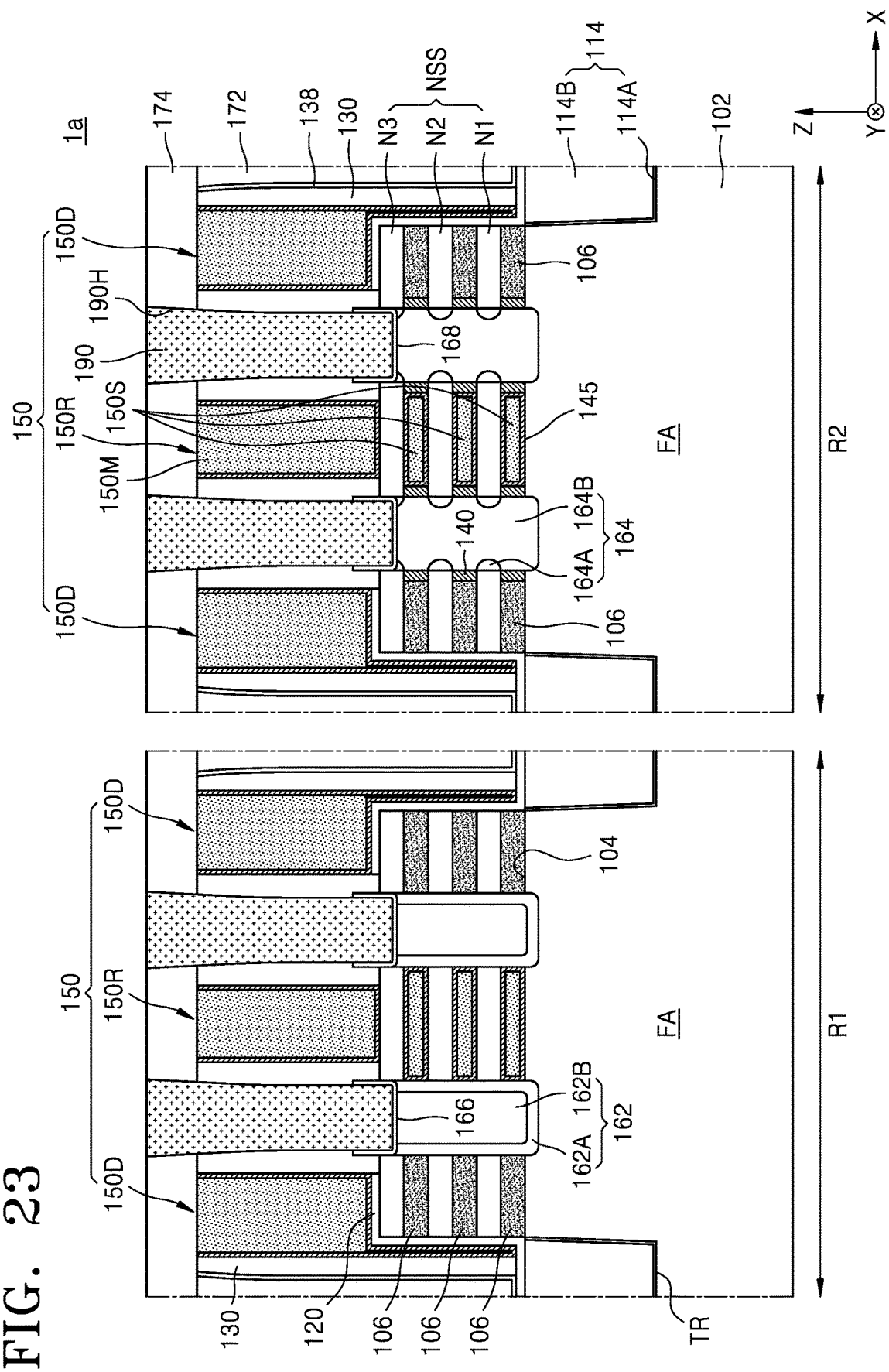

Referring to FIG. 23, a protective film 138, an inter-gate insulating film 172, a gate dielectric layer 145, a gate electrode 150, an inter-layer insulating film 174, a plurality of contact holes 190H, a first metal silicide film 166, a second metal silicide film 168, and a plurality of contact plugs 190 are formed as a semiconductor device 1a.

The real gate electrode 150R of the plurality of gate electrodes 150 may include a main gate portion 150M and a plurality of sub-gate portions 150S.

In each of the first region R1 and the second region R2, the dummy gate electrode 150D includes only the main gate portion 150M and may not include the plurality of sub-gate portions 150S.

In each of the first region R1 and the second region R2, the semiconductor device 1a may include a blocking film 120 covering a part of the upper surface and one sidewall of each of a pair of nanosheet stacked structures NSS adjacent to both sides of the fin-type active area FA among the plurality of nanosheet stacked structures NSS. The blocking films 120 formed in the first region R1 and the second region R2 may be referred to as a first blocking film and a second blocking film, respectively.

In each of the first region R1 and the second region R2, a plurality of residual semiconductor patterns 106 may be disposed between the fin-type active area FA and each of the plurality of nanosheets N1, N2, and N3 included in a pair of nanosheet stacked structures NSS adjacent to both sides of the fin-type active area FA among the plurality of nanosheet stacked structures NSS.

An insulating spacer 140 in contact with the second source/drain region 164 is formed in a space between the plurality of respective nanosheets N1, N2, and N3 in the second region R2. The insulating spacer 140 may be between the sub-gate portion 150S and the second source/drain region 164 and between the residual semiconductor pattern and the second source/drain region 164, in the space between the plurality of respective nanosheets N1, N2, and N3.

Since the semiconductor device 1a according to the present disclosure includes a blocking film 120, in the first region R1 and the second region R2, for preventing the first source/drain region 162 and the second source/drain region 164 from being damaged in the process of forming a gate electrode, particularly a sub-gate portion 150S, a short circuit between the first source/drain region 162 and the gate electrode 150 and/or between the second source/drain region 164 and the gate electrode 150 may be prevented, thereby ensuring reliability.

FIGS. 24 to 27 are cross-sectional views illustrating a method of manufacturing a semiconductor device, according to embodiments of the present disclosure, and a semiconductor device manufactured by the method, according to a process order. Specifically, FIGS. 24 to 27 are cross-sectional views taken along the X-Z plane about operations after the operations of FIG. 8, and the points that have already been described with reference to FIGS. 1 to 16 will be omitted in the description of FIGS. 24 to 27.

Figure 24:
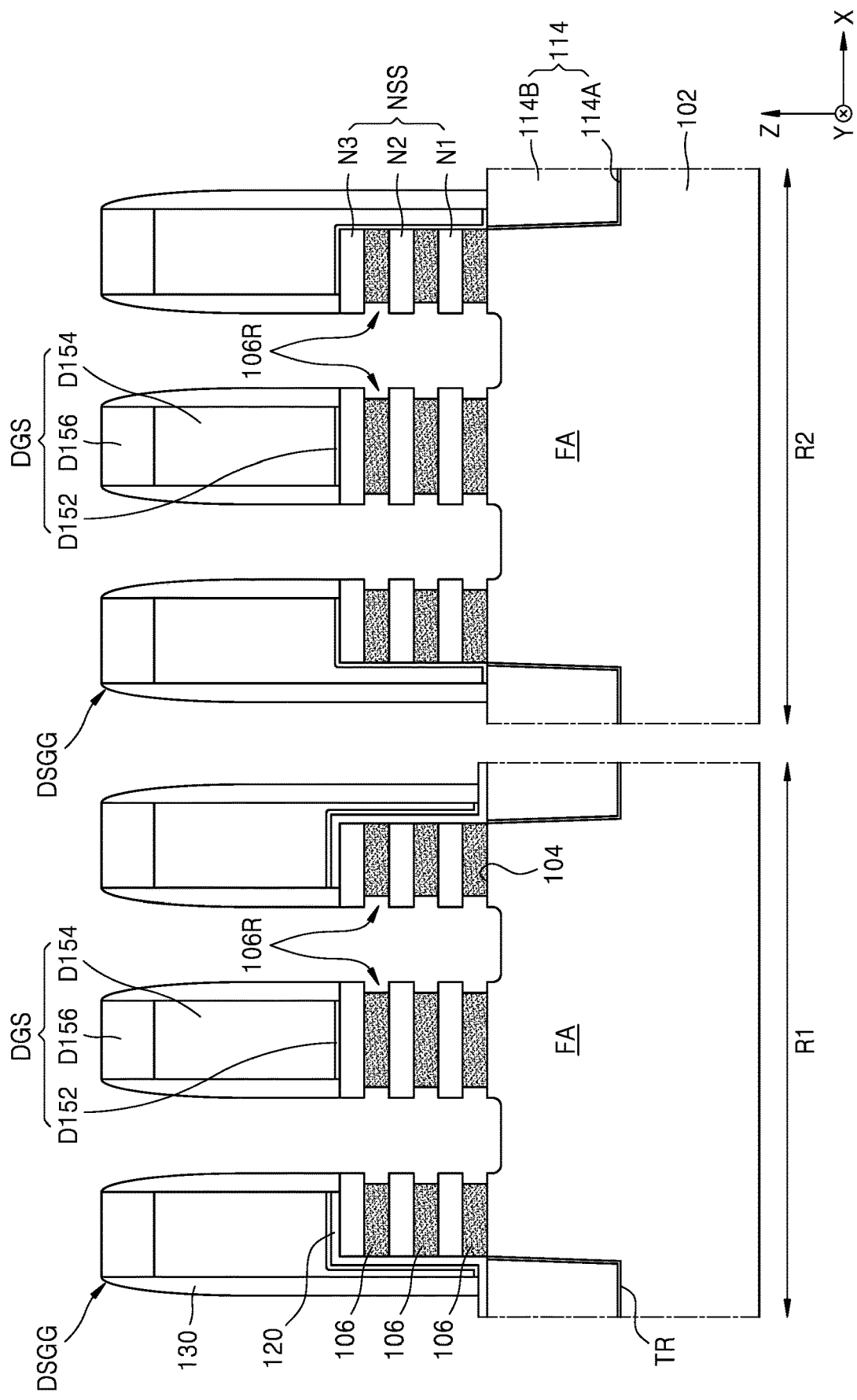
FIGS. 24 to 27 are cross-sectional views illustrating a method of manufacturing a semiconductor device, according to exemplary embodiments of the present disclosure, and a semiconductor device manufactured by the method, according to a process order.

Referring to FIG. 24, a recess region 106R is formed between the plurality of respective nanosheets N1, N2, and N3 by removing a part of the plurality of sacrificial semiconductor patterns 106 exposed on both sides of each of the plurality of nanosheet stacked structures NSS by using an isotropic etching process for each of the first region R1 and the second region R2.

Figure 25:
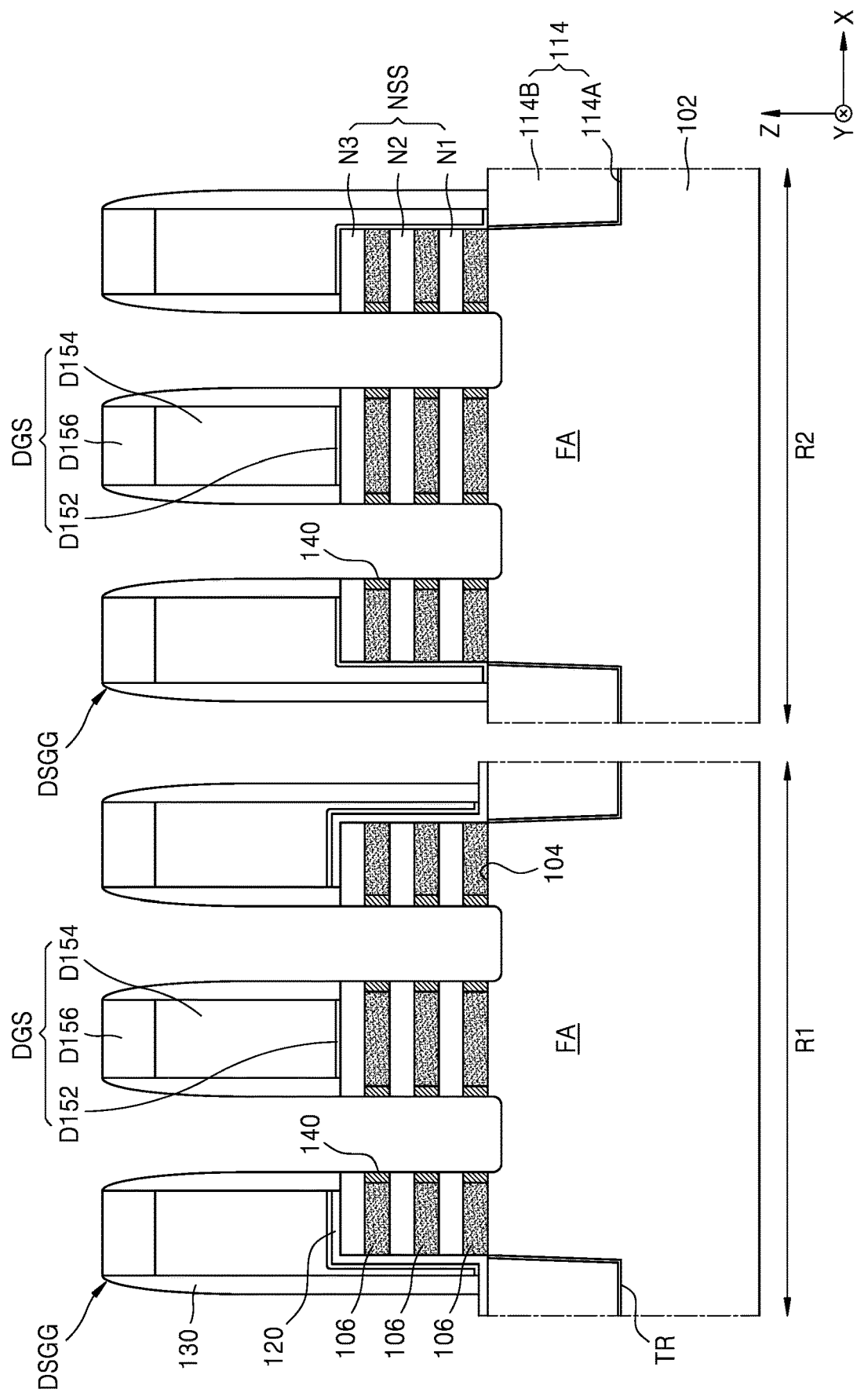

Referring to FIGS. 24 and 25 together, the insulating spacer 140 filling the recess region 106R formed between the plurality of respective nanosheets N1, N2, and N3 is formed in the first region R1 and the second region R2, respectively.

Figure 26:
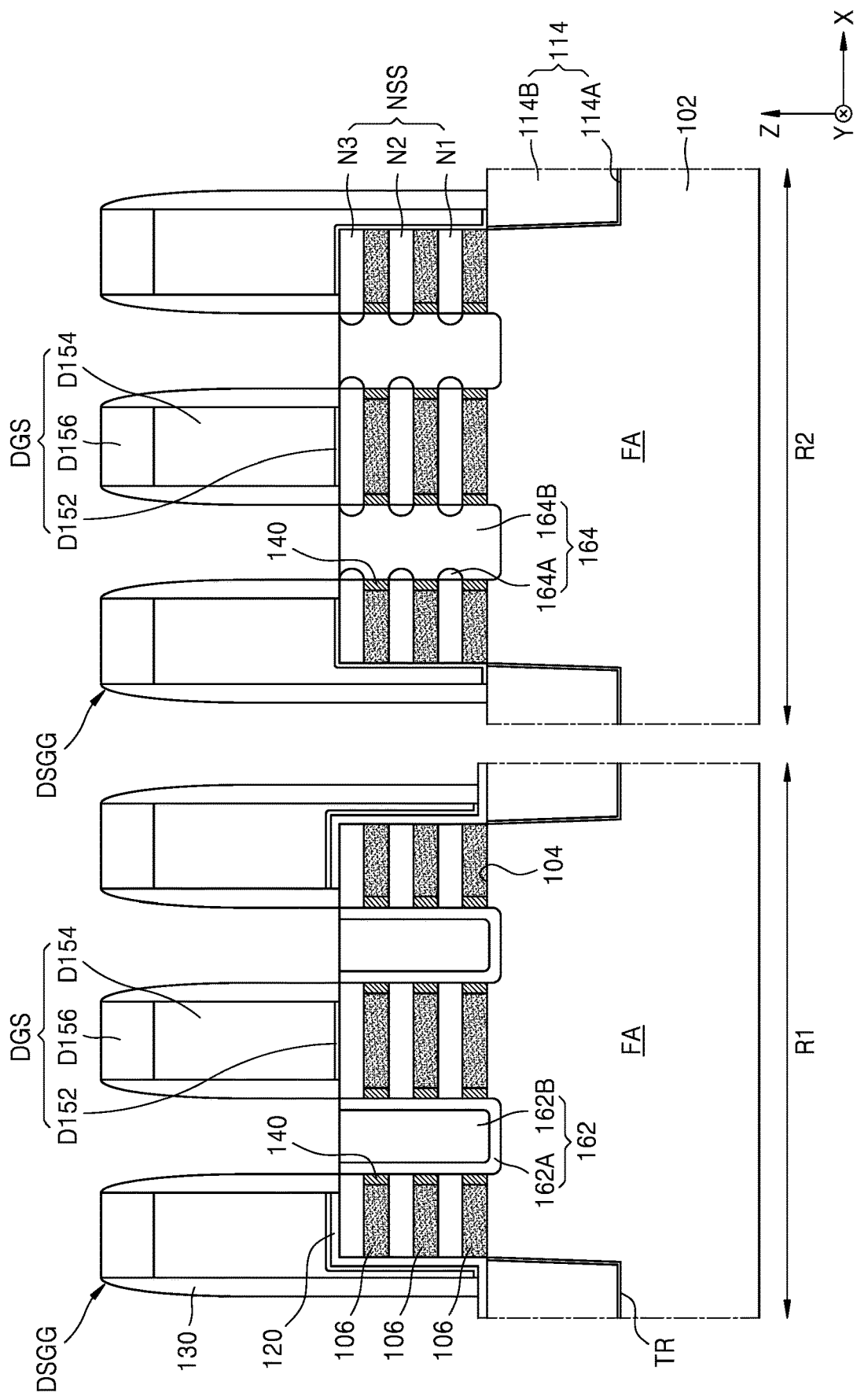

Referring to FIG. 26, the sidewalls of the plurality of nanosheets N1, N2, and N3 and the surface of the fin-type active area FA exposed between the respective nanosheet stacked structures NSS are exposed to a cleaning atmosphere to thereby remove a native oxide film from the exposed surfaces.

Thereafter, in the first region R1, a first source/drain region 162 is formed by allowing a semiconductor material to be epitaxially grown from both exposed sidewalls of the plurality of nanosheets N1, N2, and N3 and the exposed surface of the fin-type active area FA, and, in the second region R2, a second source/drain region 164 is formed by allowing a semiconductor material to be epitaxially grown from both exposed sidewalls of the plurality of nanosheets N1, N2, and N3 and the exposed surface of the fin-type active area FA.

The first source/drain region 162 may include a first cover layer 162A and a first buried layer 162B. The first cover layer 162A may be formed in the first region R1 in order to cover exposed both sidewalls of the plurality of nanosheets N1, N2, and N3, both sidewalls of the plurality of sacrificial semiconductor patterns 106, and the exposed surface of the tin-type active area FA, and the first buried layer 162B may be formed on the first cover layer 162A in the first region R1 to fill a space between the plurality of nanosheet stacked structures NSS.

The second source/drain region 164 may include a second cover layer 164A and a second buried layer 164B. The second cover layer 164A may be formed to cover the exposed both sidewalls of the plurality of nanosheets N1, N2, and N3 in the second region R2, and the second buried layer 164B may be formed on the second cover layer 164A in the second region R2 to fill a space between the plurality of nanosheet stacked structures NSS.

Figure 27:
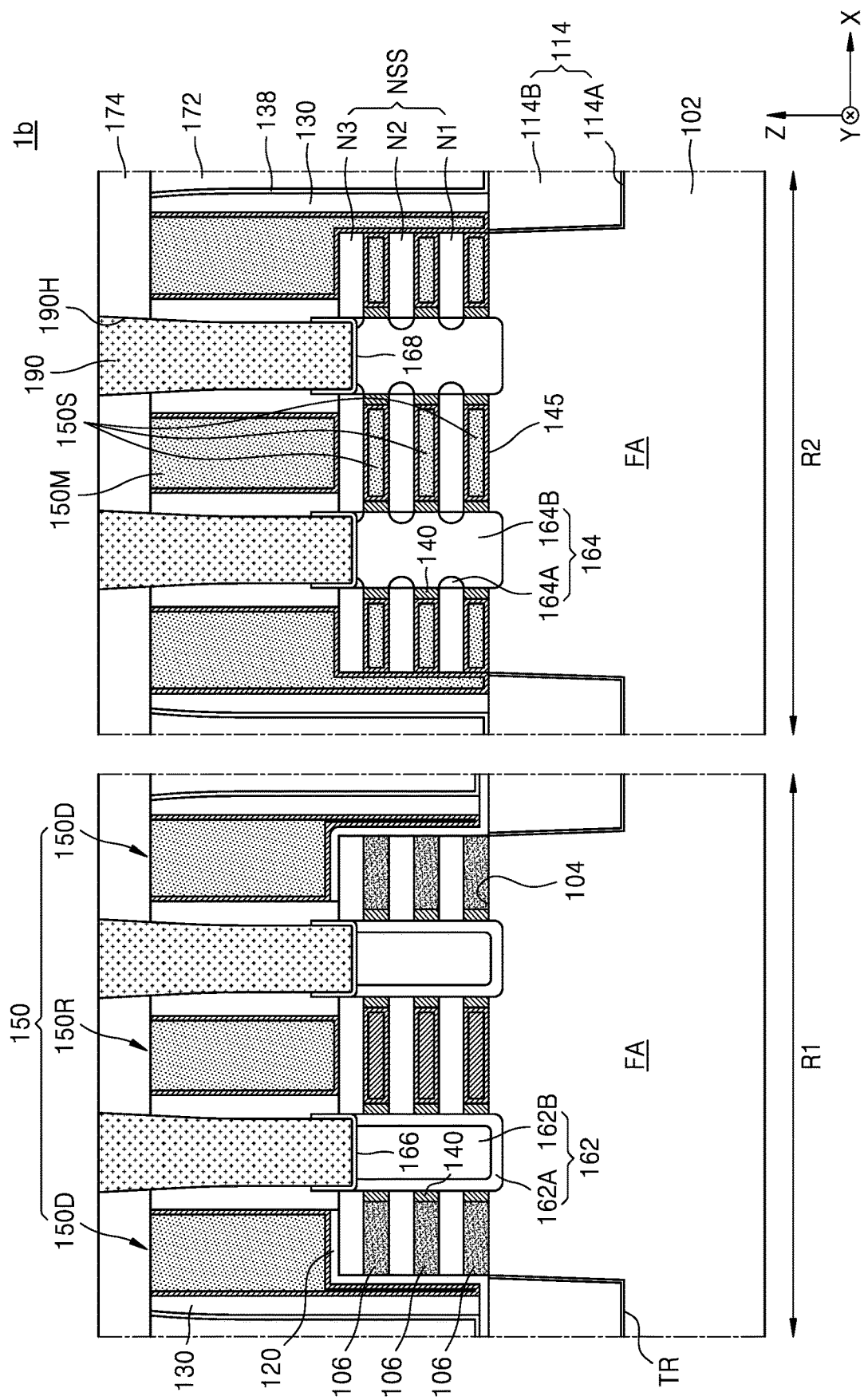

Referring to FIG. 27, a protective film 138, an inter-gate insulating film 172, a gate dielectric layer 145, a gate electrode 150, an inter-layer insulating film 174, a plurality of contact holes 190H, a first metal silicide film 166, a second metal silicide film 168, and a plurality of contact plugs 190 are formed as a semiconductor device 1b.

In the first region R1, the semiconductor device 1b may include a blocking film 120 covering a part of the upper surface and one sidewall of each of a pair of nanosheet stacked structures NSS adjacent to both sides of the fin-type active area FA among the plurality of nanosheet stacked structures NSS.

The semiconductor device 1b may include insulating spacers 140 in contact with the first source/drain region 162 and the second source/drain region 164 in a space between the plurality of respective nanosheets N1, N2, and N3 in each of the first region R1 and the second region R2. The insulating spacer 140 may be between the sub-gate portion 150S and the first source/drain region 162 in a space between the plurality of nanosheets N1, N2, and N3 in the first region, or may be between the sub-gate portion 150S and the second source/drain region 164 in a space between the plurality of respective nanosheets N1, N2, and N3 in the second region R2.

Since the semiconductor device 1b according to the present disclosure includes a blocking film 120 for preventing the first source/drain region 162 from being damaged in the process of forming the gate electrode 150, particularly, the sub-gate portion 150S and includes insulating spacers 140 in the first region R1 and the second region R2, a short circuit between the first source/drain region 162 and the gate electrode 150 and/or between the second source/drain region 164 and the gate electrode 150 may be prevented, thereby ensuring reliability.

Figure 28:
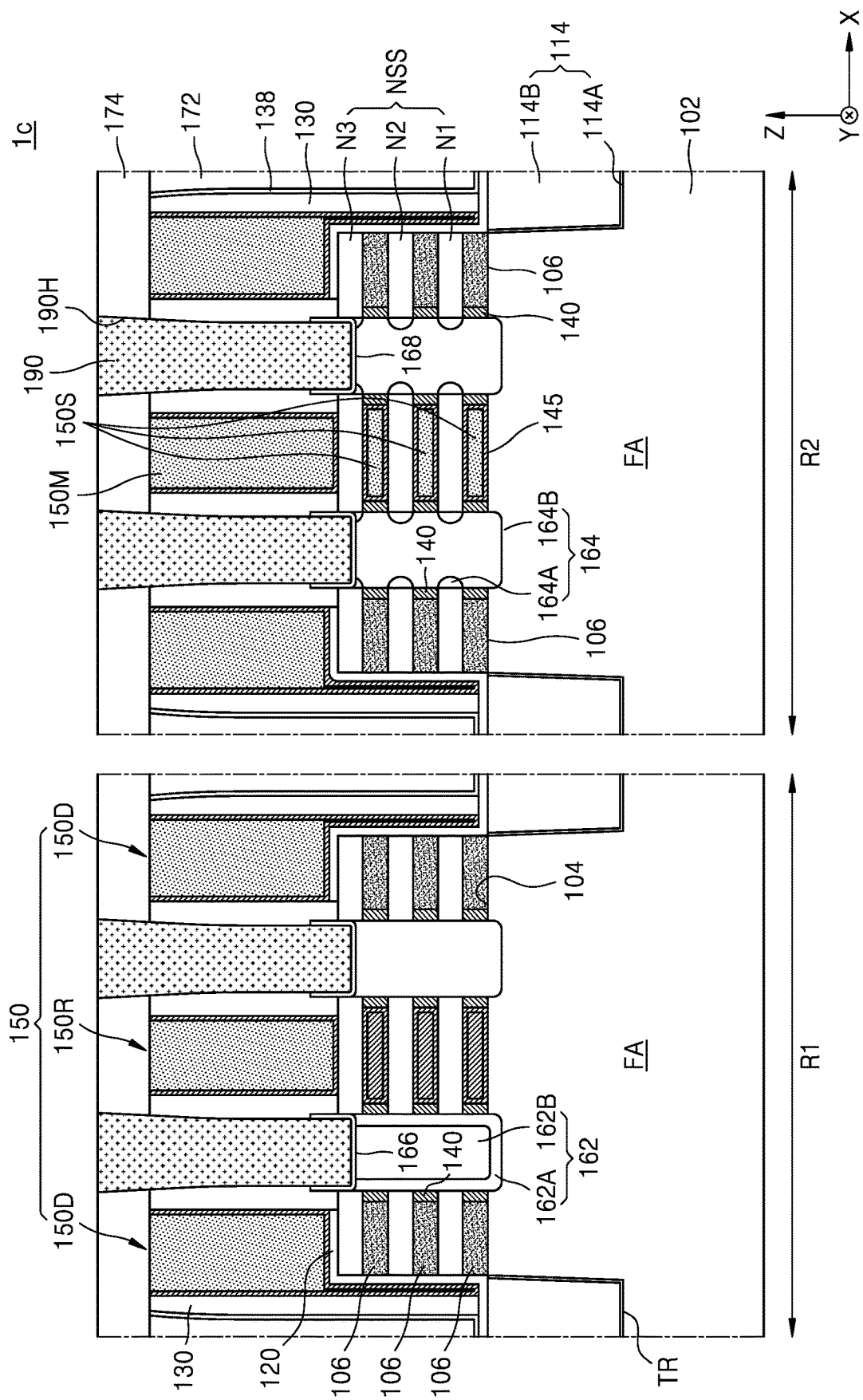
FIG. 28 is a cross-sectional view illustrating a semiconductor device manufactured by a method of manufacturing a semiconductor device, according to exemplary embodiments of the present disclosure. Specifically.

FIG. 28 is a cross-sectional view illustrating a semiconductor device manufactured by a method of manufacturing a semiconductor device, according to embodiments of the present disclosure. Specifically, FIG. 28 is a cross-sectional view taken along the X-Z plane. The points that have already been described with reference to FIGS. 1 to 27 may be omitted in the description of FIG. 28.

Referring to FIG. 28, in each of the first region R1 and the second region R2, the semiconductor device 1c may include a blocking film 120 covering a part of the upper surface and one sidewall of each of a pair of nanosheet stacked structures NSS adjacent to both sides of the fin-type active area FA among the plurality of nanosheet stacked structures NSS. In each of the first region R1 and the second region R2, a plurality of residual semiconductor patterns 106 may be disposed between the fin-type active area FA and each of the plurality of nanosheets N1, N2, and N3 included in a pair of nanosheet stacked structures NSS adjacent to both sides of the fin-type active area FA among the plurality of nanosheet stacked structures NSS.

The semiconductor device 1c may include insulating spacers 140 in contact with the first source/drain region 162 and the second source/drain region 164 in a space between the plurality of respective nanosheets N1, N2, and N3 in each of the first region R1 and the second region R2. The insulating spacer 140 may be between the sub-gate portion 150S and the first source/drain region 162 and between the residual semiconductor pattern and the first source/drain region 162, respectively, in the space between the plurality of respective nanosheets N1, N2, and N3, in the first region, and may be between the sub-gate portion 150S and the second source/drain region 164 and between the residual semiconductor pattern and the second source/drain region 164, respectively, in the space between the plurality of respective nanosheets N1, N2, and N3, in the second region.

In the second region R2, the insulating spacers 140 may cover one sidewall of each of the plurality of sub-gate portions 150S of the dummy gate electrode 150D, specifically, one sidewall toward the real gate electrode 150R with the gate dielectric layer 145 therebetween.

Since the semiconductor device 1c according to the present disclosure includes a blocking film 120 and insulating spacers 140 for preventing the first source/drain region 162 from being damaged in the process of forming the gate electrode 150, particularly, the sub-gate portion 150S, a short circuit between the first source/drain region 162 and the gate electrode 150 and/or between the second source/drain region 164 and the gate electrode 150 may be prevented, thereby ensuring reliability.

While the inventive concept has been particularly shown and described with reference to embodiments thereof, it will be understood that various changes in form and details may be made therein without departing from the spirit and scope of the following claims.

What is claimed is:

1. A semiconductor device comprising:
   a fin-type active area extending lengthwise in a first direction and protruding from a substrate;
   a plurality of nanosheet stacked structures extending in parallel with an upper surface of the fin-type active area at a position spaced above the upper surface of the fin-type active area, each of the plurality of nanosheet stacked structures having a plurality of nanosheets having a channel region;
   a blocking film covering a part of the upper surface and one sidewall of each of a pair of nanosheet stacked structures adjacent to both sides of the fin-type active area among the plurality of nanosheet stacked structures;
   a gate electrode extending lengthwise in a second direction intersecting the first direction on the fin-type active area, the gate electrode including a real gate electrode surrounding the plurality of nanosheets and a dummy gate electrode disposed on the blocking film; and
   a gate dielectric layer between the real gate electrode and the plurality of nanosheets and between the dummy gate electrode and the blocking film.

2. The semiconductor device of claim 1,
   wherein the gate electrode includes a main gate portion having a first thickness on the plurality of nanosheets and a plurality of sub-gate portions having a second thickness less than the first thickness and filling a space between the fin-type active area and the plurality of nanosheets, and
   wherein the real gate electrode includes the main gate portion and the plurality of sub-gate portions, and the dummy gate electrode includes the main gate portion without including the plurality of sub-gate portions.

3. The semiconductor device of claim 2, further comprising:
   an insulating spacer in a space between the fin-type active area and the plurality of nanosheets.

4. The semiconductor device of claim 3, wherein the insulating spacer covers both sidewalls of each of the plurality of sub-gate portions with the gate dielectric layer between the insulating spacer and the each of the plurality of sub-gate portions.

5. The semiconductor device of claim 1, further comprising:
   a plurality of residual semiconductor patterns between the fin-type active area and the plurality of nanosheets of the nanosheet stacked structures covered by the blocking film.

6. The semiconductor device of claim 5, wherein the plurality of residual semiconductor patterns and the plurality of nanosheets comprise different semiconductor materials.

7. The semiconductor device of claim 5, further comprising:
   a source/drain region disposed between the plurality of nanosheet stacked structures; and
   an insulating spacer in a space between the fin-type active area and the plurality of nanosheets,
   wherein the insulating spacer is disposed between the real gate electrode and the source/drain region and between the plurality of residual semiconductor patterns and the source/drain region.

8. The semiconductor device of claim 1, further comprising:
   a source/drain region which is connected to the plurality of nanosheets and includes a cover layer and a buried layer on the cover layer,
   wherein the cover layer comprises a semiconductor material not including Ge, and the buried layer is made of a semiconductor material including Ge.

9. The semiconductor device of claim 8, wherein the gate dielectric layer between the real gate electrode and the plurality of nanosheets is in contact with the source/drain region.

10. The semiconductor device of claim 1, further comprising:
    a source/drain region including a cover layer covering at least one sidewall of the plurality of nanosheets and a buried layer on the cover layer,
    wherein each of the cover layer and the buried layer comprises a semiconductor material not including Ge.

11. A semiconductor device comprising:
    a substrate including a first region and a second region;
    a fin-type active area extending lengthwise in a first direction and protruding from the substrate in each of the first region and the second region;
    a plurality of nanosheet stacked structures extending in parallel with an upper surface of the fin-type active area at a position spaced above the upper surface of the fin-type active area, each of the plurality of nanosheet stacked structures having a plurality of nanosheets having a channel region;
    a blocking film covering a part of an upper surface and one sidewall of each of a pair of nanosheet stacked structures adjacent to both sides of the fin-type active area among the plurality of nanosheet stacked structures, in the first region;
    a plurality of gate electrodes overlapping with at least a portion of each of the plurality of nanosheet stacked structures on the fin-type active area and extending lengthwise in a second direction intersecting the first direction; and
    a plurality of residual semiconductor patterns in a space between the fin-type active area and the plurality of nanosheets of the pair of nanosheet stacked structures covered by the blocking film among the plurality of nanosheet stacked structures, wherein a portion of the plurality of gate electrodes, which extends on the nanosheet stacked structures not covered by the blocking film, fills a space between the plurality of nanosheets and the fin-type active area.

12. The semiconductor device of claim 11, further comprising:

a first source/drain region and a second source/drain region which are disposed between the plurality of nanosheet stacked structures to be connected to the plurality of nanosheets and are made of different materials.

13. The semiconductor device of claim 12, further comprising:

a plurality of insulating spacers in a space between the fin-type active area and the plurality of nanosheets, in the second region, wherein the second source/drain region is spaced apart from the gate electrodes with the insulating spacers between the second source/drain region and the gate electrodes.

14. The semiconductor device of claim 12, wherein the plurality of residual semiconductor patterns are in contact with the first source/drain region.

15. The semiconductor device of claim 12, further comprising:

a plurality of insulating spacers in a space between the fin-type active area and the plurality of nanosheets, in each of the first region and the second region, wherein the plurality of residual semiconductor patterns are spaced apart from the first source/drain region with the plurality of insulating spacers therebetween.

16. A semiconductor device comprising:

a substrate including a first region and a second region;

a fin-type active area extending lengthwise in a first direction and protruding from the substrate in each of the first region and the second region;

a plurality of nanosheet stacked structures extending lengthwise in parallel with an upper surface of the fin-type active area at a position spaced above the upper surface of the fin-type active area, each of the plurality of nanosheet stacked structures having a plurality of nanosheets having a channel region;

a first source/drain region and a second source/drain region which are disposed in the first region and the second region between the plurality of nanosheet stacked structures to be connected to the plurality of nanosheets and are made of different materials from each other;

a first blocking film covering a part of an upper surface and one sidewall of each of a pair of nanosheet stacked structures adjacent to both sides of the fin-type active area among the plurality of nanosheet stacked structures, in the first region;

a plurality of gate electrodes overlapping with at least a portion of each of the plurality of nanosheet stacked structures on the fin-type active area and extending in a second direction intersecting the first direction; and a gate dielectric layer between the plurality of gate electrodes and the plurality of nanosheets, wherein the plurality of nanosheets included in each of the pair of nanosheet stacked structures covered by the first blocking film are spaced apart from a gate dielectric film with the first blocking film therebetween, and wherein the plurality of nanosheets included in a remainder of the plurality of nanosheets stacked structures are in contact with the gate dielectric layer.

17. The semiconductor device of claim 16, further comprising:

a second blocking film covering one sidewall and a portion of an upper surface of each of a pair of nanosheet stacked structures adjacent to both sides of the fin-type active area among the plurality of nanosheet stacked structures, in the second region.

18. The semiconductor device of claim 16, wherein the first source/drain region comprises a first cover layer integrally extending to contact each of the plurality of nanosheets, and a first buried layer on the first cover layer.

19. The semiconductor device of claim 18, further comprising:

a plurality of residual semiconductor patterns between the fin-type active area and the plurality of nanosheets of the pair of nanosheet stacked structures covered by the first blocking film among the plurality of nanosheet stacked structures, wherein the first cover layer and the plurality of residual semiconductor patterns comprise different materials.

20. The semiconductor device of claim 16, wherein the second source/drain region comprises a plurality of second cover layers contacting the plurality of nanosheets, respectively, and a second buried layer on the second cover layers.

* * * * *